(12) United States Patent
Toumiya et al.

(10) Patent No.: US 8,981,275 B2
(45) Date of Patent: *Mar. 17, 2015

(54) SOLID-STATE IMAGE PICKUP DEVICE WITH AN OPTICAL WAVEGUIDE, METHOD FOR MANUFACTURING SOLID-STATE IMAGE PICKUP DEVICE, AND CAMERA

(75) Inventors: Yoshinori Toumiya, Kanagawa (JP); Keiji Tatani, Kanagawa (JP); Haruhiko Ajisawa, Kanagawa (JP); Yuji Inoue, Nagasaki (JP); Tetsuhiro Iwashita, Kagoshima (JP); Hideaki Kato, Nagasaki (JP)

(73) Assignee: Sony Corporation (JP)

( * ) Notice: Subject to any disclaimer, the term of this patent is extended or adjusted under 35 U.S.C. 154(b) by 1 day.

This patent is subject to a terminal disclaimer.

(21) Appl. No.: 13/181,626

(22) Filed: Jul. 13, 2011

(65) Prior Publication Data

US 2011/0267512 A1 Nov. 3, 2011

Related U.S. Application Data

(60) Continuation of application No. 12/579,593, filed on Oct. 15, 2009, now Pat. No. 8,003,929, which is a division of application No. 11/950,680, filed on Dec. 5, 2007, now Pat. No. 7,973,271.

(30) Foreign Application Priority Data

Dec. 8, 2006 (JP) .................................. 2006-332421
Apr. 16, 2007 (JP) .................................. 2007-106900

(51) Int. Cl.
*H01L 27/00* (2006.01)
*G01J 1/44* (2006.01)
(Continued)

(52) U.S. Cl.
CPC .... *H01L 27/14687* (2013.01); *H01L 27/14625* (2013.01); *H01L 27/14627* (2013.01);
(Continued)

(58) Field of Classification Search
CPC ................... H01L 27/14643; H01L 27/14609; H01L 27/14645; H01L 27/14647; H01L 27/14649; H01L 27/1465; H01L 27/14652; H01L 27/14654; H01L 27/14667; H01L 27/14669; H01L 27/1467; H01L 27/14672; H01L 27/148; H01L 27/14806; H01L 27/14812; H04N 3/155
USPC .......... 250/208.1, 214 R, 216, 214.1, 227.11, 250/227.2; 257/290–294, 414, 431–466; 348/272–281, 294, 302, 311; 438/48, 438/57, 59, 60, 66, 73, 85
See application file for complete search history.

(56) References Cited

U.S. PATENT DOCUMENTS 4,521,443 A * 6/1985 Naik et al. ................... 427/526
5,986,704 A 11/1999 Asai et al.
(Continued)

FOREIGN PATENT DOCUMENTS

JP 08-139300 5/1996
JP 2004-221532 8/2004
WO 2006/115142 11/2006

*Primary Examiner* — Pascal M Bui Pho
(74) *Attorney, Agent, or Firm* — Sheridan Ross P.C.

(57) ABSTRACT

A solid-state image pickup device includes a plurality of pixels on a light-receiving surface, photodiodes disposed on the light-receiving surface of a semiconductor substrate while being partitioned on the pixel basis, signal transferring portions which are disposed on the semiconductor substrate and which read signal charges generated and stored in the photodiodes or voltages corresponding to the signal charges, insulating films disposed on the semiconductor substrate while covering the photodiodes, concave portions disposed in the insulating films, pad electrodes disposed on the insulating films, a passivation film which covers inner walls of the concave portions, which is disposed on the pad electrodes, and which has a refractive index higher than that of silicon oxide, and a core layer which is disposed on the passivation film while being filled in the concave portions and which has a refractive index higher than that of silicon oxide.

20 Claims, 17 Drawing Sheets

(51) Int. Cl.
*H01L 27/146* (2006.01)
*H01L 27/148* (2006.01)

(52) U.S. Cl.
CPC .... *H01L27/14629* (2013.01); *H01L 27/14632* (2013.01); *H01L 27/14643* (2013.01); *H01L 27/14685* (2013.01); *H01L 27/14689* (2013.01); *H01L 27/148* (2013.01)
USPC .................................. 250/208.1; 250/214 R

(56) References Cited

U.S. PATENT DOCUMENTS

| | | | |
|---|---|---|---|
| 6,069,350 A | 5/2000 | Ohtsuka et al. | |
| 6,653,617 B2 * | 11/2003 | Hiyama et al. | 250/214.1 |
| 7,193,289 B2 * | 3/2007 | Adkisson et al. | 257/431 |
| 7,196,365 B2 | 3/2007 | Yamamura | |
| 7,233,037 B2 | 6/2007 | Nakahashi et al. | |
| 7,524,690 B2 * | 4/2009 | Ko et al. | 438/31 |
| 7,545,016 B2 * | 6/2009 | Holz | 257/461 |
| 7,666,704 B2 * | 2/2010 | Suzuki et al. | 438/69 |
| 7,973,271 B2 * | 7/2011 | Toumiya et al. | 250/208.1 |
| 2004/0140564 A1 * | 7/2004 | Lee et al. | 257/758 |
| 2005/0072906 A1 * | 4/2005 | Dobashi | 250/208.1 |
| 2005/0285215 A1 | 12/2005 | Lee et al. | |
| 2006/0054946 A1 | 3/2006 | Baek et al. | |
| 2006/0115230 A1 | 6/2006 | Komoguchi et al. | |
| 2006/0141653 A1 | 6/2006 | Choi | |
| 2006/0220073 A1 | 10/2006 | Kooriyama | |
| 2007/0080419 A1 * | 4/2007 | Shizukuishi | 257/462 |
| 2007/0262366 A1 | 11/2007 | Baek et al. | |

* cited by examiner

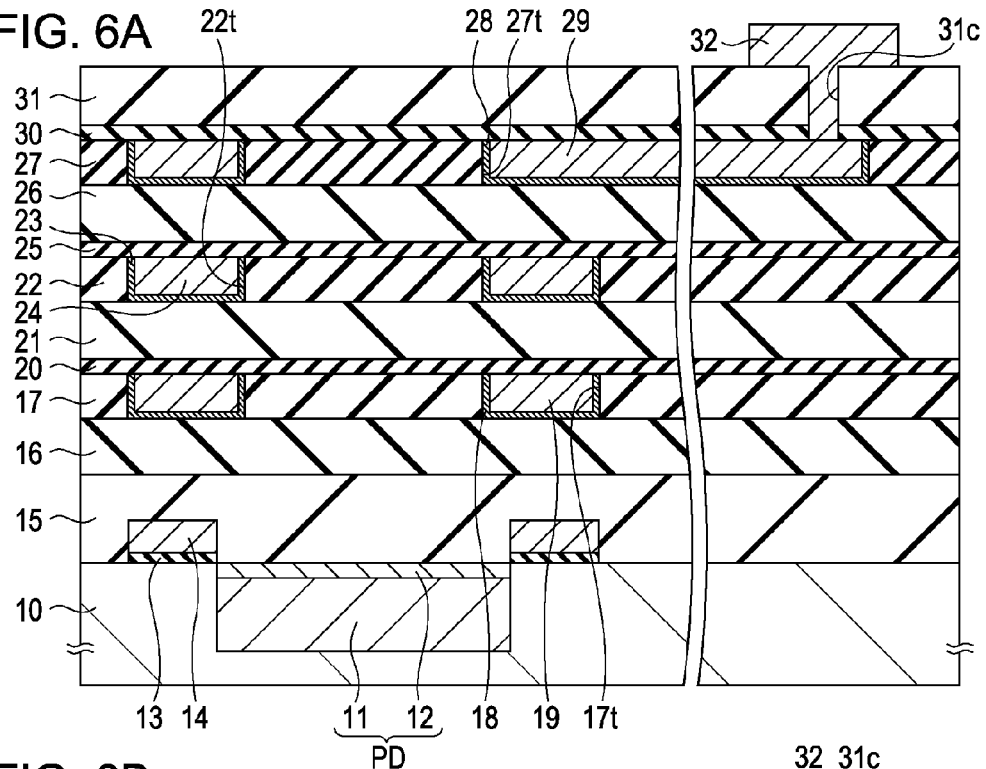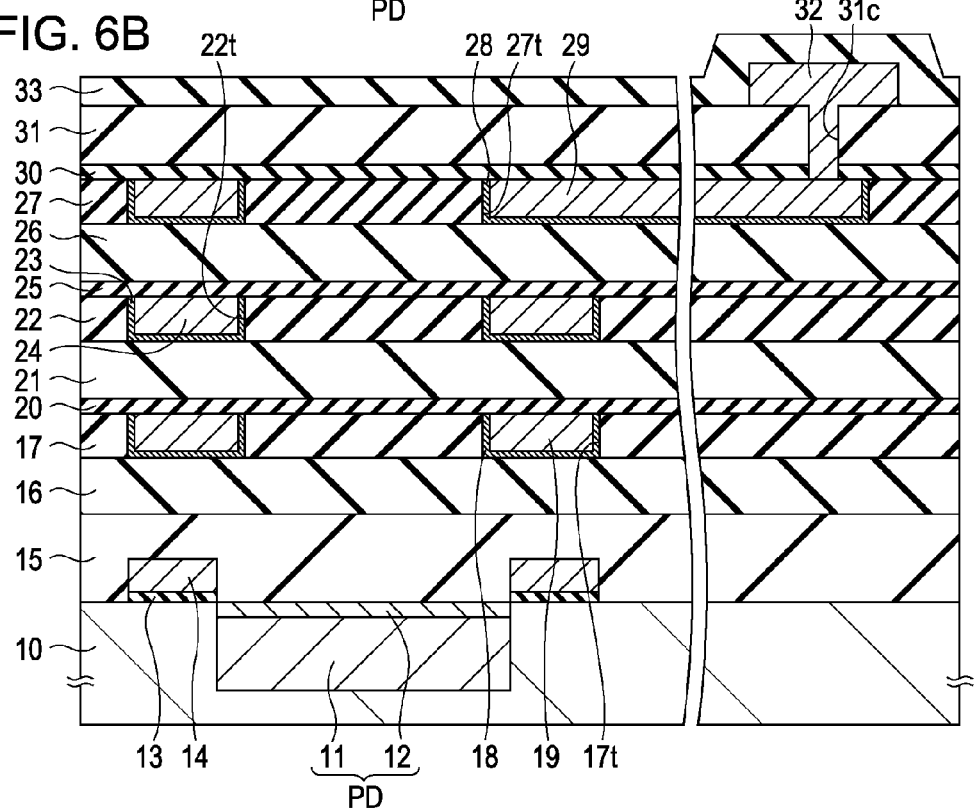

SOLID-STATE IMAGE PICKUP DEVICE WITH AN OPTICAL WAVEGUIDE, METHOD FOR MANUFACTURING SOLID-STATE IMAGE PICKUP DEVICE, AND CAMERA

RELATED APPLICATION DATA

This application is a continuation of U.S. patent application Ser. No. 12/579,593, filed Oct. 15, 2009, which is a division of U.S. patent application Ser. No. 11/950,680, filed Dec. 5, 2007, the entirety of which is incorporated herein by reference to the extent permitted by law. The present invention contains subject matter related to Japanese Patent Applications JP 2006-332421 and JP 2007-106900 filed in the Japanese Patent Office on Dec. 8, 2006 and Apr. 16, 2007, respectively, the entire contents both of which are incorporated herein by reference to the extent permitted by law.

BACKGROUND OF THE INVENTION

The present invention relates to a solid-state image pickup device, a method for manufacturing the solid-state image pickup device, and a camera. In particular, the present invention relates to a solid-state image pickup device, in which pixels having diodes are arranged in a matrix on a light-receiving surface, the method for manufacturing the solid-state image pickup device, and a camera provided with the solid-state image pickup device.

For example, in the configuration of a solid-state image pickup device, e.g., a CMOS sensor or a CCD element, light is allowed to enter photodiodes (photoelectric conversion portion) disposed on a surface of a semiconductor substrate, and an image signal is obtained on the basis of signal charges generated in the photodiodes.

In the CMOS sensor, for example, pixels are arranged in a two-dimensional matrix on a light-receiving surface, and a photodiode is disposed on the pixel basis. Signal charges generated and stored in each photodiode during reception of light are transferred to a floating diffusion by driving a CMOS circuit, and the signal charges are converted to signal voltages so as to be read.

In the CCD element, for example, pixels are arranged in a two-dimensional matrix on a light-receiving surface, and a photodiode is disposed on the pixel basis, as in the CMOS sensor. Signal charges generated and stored in each photodiode during reception of light are transferred through a CCD vertical transfer line and a horizontal transfer line so as to be read.

In the above-described solid-state image pickup device, e.g., a CMOS sensor, for example, the above-described photodiodes are disposed on a surface of a semiconductor substrate. An insulating film of, for example, silicon oxide, is disposed as a layer covering the photodiodes. Wiring layers are disposed in the insulating film except photodiode regions so as to avoid hindering the entrance of light into the photodiodes.

However, regarding the above-described solid-state image pickup device, the area of the light-receiving surface has been reduced as elements have been made finer. Accompanying this, a problem occurs in that the rate of incident light decreases and the sensitivity characteristics deteriorate.

A structure, in which light is condensed by using an on-chip lens, an interlayer lens, or the like, has been developed as a countermeasure against this. In particular, a solid-state image pickup device has been developed, in which an optical waveguide for guiding the light incident from the outside to a photodiode has been disposed in the insulating film above the photodiode.

Japanese Unexamined Patent Application Publication Nos. 2003-224249 and 2003-324189 disclose solid-state image pickup devices in which concave portions are disposed in insulating films above photodiodes, the concave portions are filled with silicon nitride that is a substance having a refractive index higher than the refractive index of silicon oxide (hereafter referred to as high-refractive index substance) and, thereby, optical waveguides for guiding the incident light to the photodiodes are disposed.

Japanese Unexamined Patent Application Publication No. 2004-207433 discloses a solid-state image pickup device in which a concave portion of an insulating film above a photodiode is filled with a silicon nitride film and a polyimide film and, thereby, an optical waveguide is disposed.

Japanese Unexamined Patent Application Publication No. 2006-190891 discloses a solid-state image pickup device in which an insulating film including a diffusion-preventing layer in the layer, a concave portion is disposed in a portion of the insulating film, the portion being above a photodiode, in such a way that the diffusion-preventing layer is removed, and the concave portion is filled with a silicon oxide film.

On the other hand, Japanese Unexamined Patent Application Publication No. 2006-222270 discloses a solid-state image pickup device, in which a concave portion of an insulating film above a photodiode is filled with a TiO-dispersion type polyimide resin and, thereby, an optical waveguide is disposed.

SUMMARY OF THE INVENTION

However, the above-described solid-state image pickup device, in which the optical waveguide for guiding the incident light to the photodiode is disposed in the insulating film above the photodiode, has a problem in that the process becomes complicated by disposition of the optical waveguide.

The heat resistance may deteriorate depending on the material constituting the optical waveguide.

Regarding a solid-state image pickup device including an optical waveguide, it is desirable to avoid the production process from becoming complicated due to disposition of the optical waveguide.

Furthermore, it is desirable to easily produce an optical waveguide provided with the high heat resistance and the high refractive index.

A solid-state image pickup device according to an embodiment of the present invention is a solid-state image pickup device having a plurality of pixels integrated on a light-receiving surface, the device including photodiodes which are disposed in pixel regions serving as the above-described light-receiving surface of a semiconductor substrate and which are partitioned on the above-described pixel basis, signal transferring portions which are disposed on the above-described semiconductor substrate and which read signal charges generated and stored in the above-described photodiodes or voltages corresponding to the above-described signal charges, insulating films disposed on the above-described semiconductor substrate while covering the above-described photodiodes, concave portions disposed in the portions of the above-described insulating films above the photodiodes, pad electrodes disposed as layers on the above-described insulating films in pad electrode regions, a passivation film which covers inner walls of the above-described concave portions, which is disposed as a layer above the pad electrodes, and which has a refractive index higher than the refractive index of silicon oxide, and a core layer which is disposed as a layer on the above-described passivation film while being filled in the above-described concave portions and which has a refractive index higher than the refractive index of silicon oxide.

The above-described solid-state image pickup device according to an embodiment of the present invention is a solid-state image pickup device having a plurality of pixels integrated on the light-receiving surface. The photodiodes are disposed in the pixel regions serving as the light-receiving surface of the semiconductor substrate, and are partitioned on the pixel basis. The signal transferring portions are disposed for reading signal charges generated and stored in the photodiodes or voltages corresponding to the signal charges. The insulating films are disposed on the semiconductor substrate while covering the photodiodes.

The concave portions are disposed in the portions of the insulating films above the photodiodes. On the other hand, the pad electrodes are disposed as layers on the insulating films in pad electrode regions. The passivation film having a refractive index higher than the refractive index of silicon oxide is disposed as a layer above the pad electrodes, while covering inner walls of the above-described concave portions. Furthermore, the core layer having a refractive index higher than the refractive index of silicon oxide is disposed as a layer on the passivation film while being filled in the concave portions.

A solid-state image pickup device according to an embodiment of the present invention is a solid-state image pickup device having a plurality of pixels integrated on a light-receiving surface, the device including photodiodes which are disposed in pixel regions serving as the above-described light-receiving surface of a semiconductor substrate and which are partitioned on the above-described pixel basis, signal transferring portions which are disposed on the above-described semiconductor substrate and which read signal charges generated and stored in the above-described photodiodes or voltages corresponding to the above-described signal charges, insulating films disposed on the above-described semiconductor substrate while covering the above-described photodiodes, concave portions disposed in the portions of the above-described insulating films above the photodiodes, and a core layer which is disposed while being filled in the above-described concave portions, and which contains an inorganic substance and a metal oxide having the heat resistance higher than the heat resistance of a TiO-dispersion organic resin.

The above-described solid-state image pickup device according to an embodiment of the present invention is a solid-state image pickup device having a plurality of pixels integrated on the light-receiving surface. The photodiodes are disposed in the pixel regions serving as the light-receiving surface of the semiconductor substrate, and are partitioned on the pixel basis. The signal transferring portions are disposed for reading signal charges generated and stored in the photodiodes or voltages corresponding to the signal charges. The insulating films are disposed on the semiconductor substrate while covering the photodiodes.

The concave portions are disposed in the portions of the insulating films above the photodiodes. The core layer is disposed while being filled in the concave portions, and contains the inorganic substance and the metal oxide having the heat resistance higher than the heat resistance of the TiO-dispersion organic resin.

A method for manufacturing a solid-state image pickup device according to an embodiment of the present invention is a method for manufacturing a solid-state image pickup device having a plurality of pixels integrated on a light-receiving surface, the method including the steps of forming photodiodes in pixel regions serving as the above-described light-receiving surface of a semiconductor substrate, the photodiodes being partitioned on the above-described pixel basis, and signal transferring portions for reading signal charges generated and stored in the above-described photodiodes or voltages corresponding to the above-described signal charges, forming insulating films on the above-described semiconductor substrate, the insulating films covering the above-described photodiodes, forming concave portions in the portions of the above-described insulating films above the photodiodes, forming pad electrodes as layers on the above-described insulating films in pad electrode regions, forming a passivation film as a layer above the pad electrodes, the passivation film covering inner walls of the above-described concave portions and having a refractive index higher than the refractive index of silicon oxide, and forming a core layer as a layer on the above-described passivation film, the core layer having a refractive index higher than the refractive index of silicon oxide and being filled in the above-described concave portions.

The above-described method for manufacturing a solid-state image pickup device according to an embodiment of the present invention is a method for manufacturing a solid-state image pickup device having a plurality of pixels integrated on the light-receiving surface. The photodiodes are formed in pixel regions serving as the light-receiving surface of the semiconductor substrate, the photodiodes being partitioned on the pixel basis. The signal transferring portions for reading signal charges generated and stored in the photodiodes or voltages corresponding to the signal charges are formed.

Subsequently, the insulating films covering the photodiodes are formed on the semiconductor substrate. The concave portions are formed in the portions of the insulating film above the photodiodes. The pad electrodes are formed as layers on the insulating films in the pad electrode regions.

The passivation film is formed as a layer on the pad electrodes, the passivation film covering inner walls of the concave portions and having a refractive index higher than the refractive index of silicon oxide. The core layer is formed as a layer on the passivation film, the core layer having a refractive index higher than the refractive index of silicon oxide and being filled in the concave portions.

A method for manufacturing a solid-state image pickup device according to an embodiment of the present invention is a method for manufacturing a solid-state image pickup device having a plurality of pixels integrated on a light-receiving surface, the method including the steps of forming photodiodes in pixel regions serving as the above-described light-receiving surface of a semiconductor substrate, the photodiodes being partitioned on the above-described pixel basis, and signal transferring portions for reading signal charges generated and stored in the above-described photodiodes or voltages corresponding to the above-described signal charges, forming insulating films on the above-described semiconductor substrate, the insulating films covering the above-described photodiodes, forming concave portions in the portions of the above-described insulating films above the photodiodes, forming a core layer by filling the above-described concave portions with an inorganic substance, the core layer having the heat resistance higher than the heat resistance of a TiO-dispersion organic resin, and ion-implanting a metal oxide into the above-described core layer.

The above-described method for manufacturing a solid-state image pickup device according to an embodiment of the present invention is a method for manufacturing a solid-state image pickup device having a plurality of pixels integrated on the light-receiving surface. The photodiodes are formed in pixel regions serving as the light-receiving surface of the semiconductor substrate, the photodiodes being partitioned on the pixel basis. The signal transferring portions for reading signal charges generated and stored in the photodiodes or voltages corresponding to the signal charges are formed.

Subsequently, the insulating films covering the photodiodes are formed on the semiconductor substrate. The concave portions are formed in the portions of the insulating film above the photodiodes.

The core layer is formed by filling the concave portions with the inorganic substance and ion-implanting the metal oxide into the core layer, the core layer having the heat resistance and the refractive index higher than those of the TiO-dispersion organic resin.

A camera according to an embodiment of the present invention includes a solid-state image pickup device having a plurality of pixels integrated on a light-receiving surface, an optical system for leading incident light to an image pickup portion of the above-described solid-state image pickup device, and a signal processing circuit for processing output signals from the above-described solid-state image pickup device, wherein the above-described solid-state image pickup device having a plurality of pixels integrated on the light-receiving surface includes photodiodes disposed in pixel regions serving as the above-described light-receiving surface of a semiconductor substrate, the photodiodes being partitioned on the above-described pixel basis, signal transferring portions which are disposed on the above-described semiconductor substrate and which read signal charges generated and stored in the above-described photodiodes or voltages corresponding to the above-described signal charges, insulating films disposed on the above-described semiconductor substrate while covering the above-described photodiodes, concave portions disposed in the portions of the above-described insulating films above the photodiodes, pad electrodes disposed as layers on the above-described insulating films in pad electrode regions, a passivation film which covers inner walls of the above-described concave portions, which is disposed as a layer above the pad electrodes, and which has a refractive index higher than the refractive index of silicon oxide, and a core layer which is disposed as a layer on the above-described passivation film while being filled in the above-described concave portions and which has a refractive index higher than the refractive index of silicon oxide.

The above-described camera according to an embodiment of the present invention includes the solid-state image pickup device having a plurality of pixels integrated on the light-receiving surface, the optical system for leading incident light to the image pickup portion of the solid-state image pickup device, and the signal processing circuit for processing output signals from the solid-state image pickup device, wherein the solid-state image pickup device has the above-described configuration.

In the configuration of the solid-state image pickup device according to an embodiment of the present invention, the concave portions are disposed in the insulating films above the photodiodes, the insulating films being disposed as layers on the photodiodes, the concave portions are filled with the high-refractive index substance so as to constitute the optical waveguide, and the passivation film disposed as a layer on the pad electrodes is also used as the high-refractive index substance to be filled in the concave portions. Therefore, the configuration can be produced by a simpler process even when the optical waveguide is disposed.

Regarding the solid-state image pickup device according to an embodiment of the present invention, the optical waveguide provided with the high heat resistance and the high refractive index can be obtained.

In the method for manufacturing a solid-state image pickup device according to an embodiment of the present invention, the passivation film disposed as the layer on the pad electrodes is also used as the high-refractive index substance to be filled in the concave portions. Therefore, the production can be performed by a simpler process even when the optical waveguide is disposed.

The method for manufacturing a solid-state image pickup device according to an embodiment of the present invention can produce the optical waveguide provided with the high heat resistance and the high refractive index.

Regarding the camera according to an embodiment of the present invention, in the solid-state image pickup device constituting the camera, the passivation film disposed as the layer on the pad electrodes is also used as the high-refractive index substance filled in the concave portions. Therefore, the configuration can be produced by a simpler process even when the optical waveguide is disposed.

BRIEF DESCRIPTION OF THE DRAWINGS

FIGS. 6A and 6B are sectional views showing a production process of a method for manufacturing the solid-state image pickup device according to the first embodiment of the present invention;

DESCRIPTION OF THE PREFERRED EMBODIMENTS

A solid-state image pickup device according to an embodiment of the present invention, a method for manufacturing the same, and an embodiment of a camera including the solid-state image pickup device will be described below with reference to drawings.

First Embodiment

Figure 1:
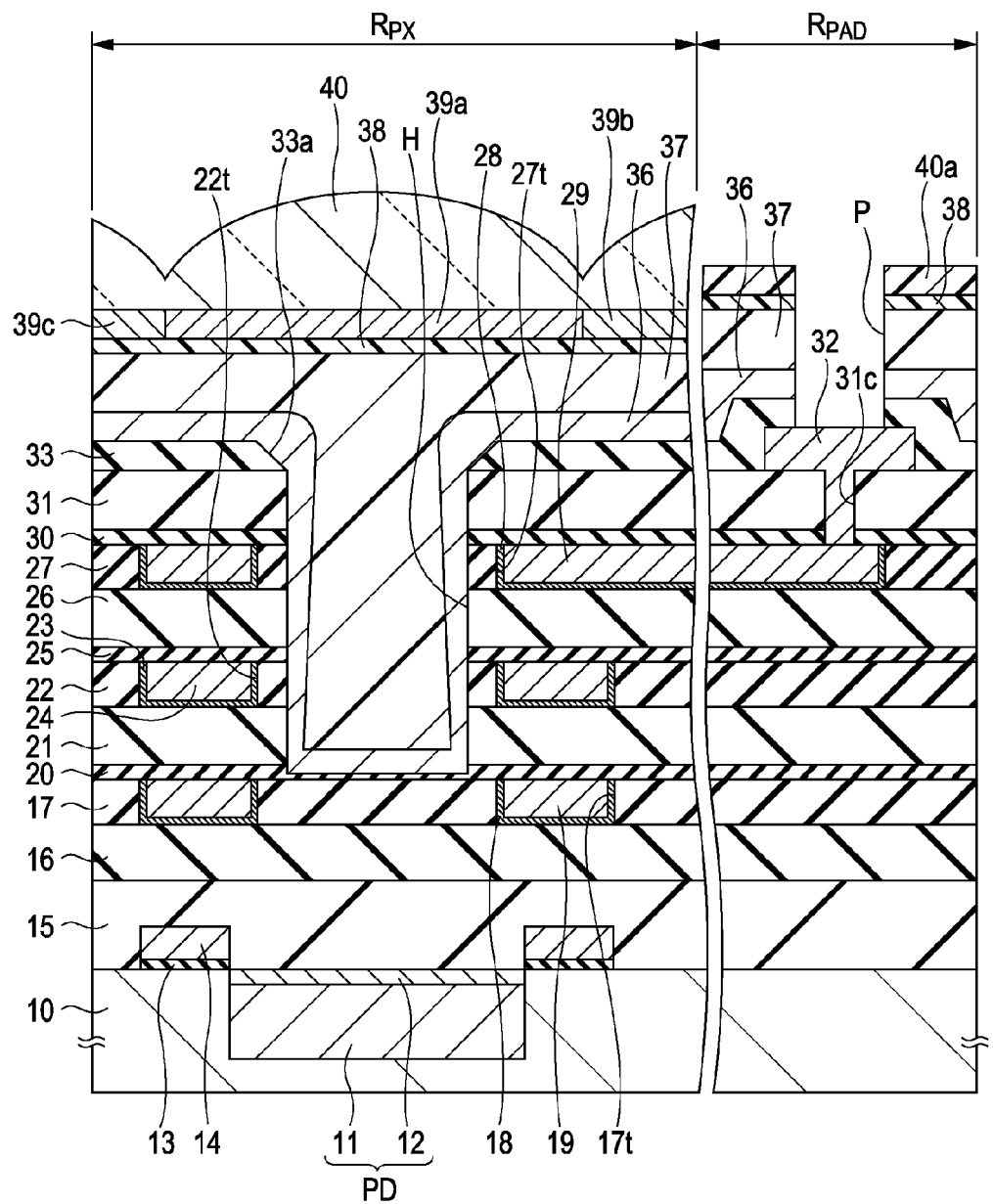
FIG. 1 is a sectional view of a solid-state image pickup device according to a first embodiment of the present invention.

FIG. 1 is a schematic sectional view of a CMOS sensor, which is a solid-state image pickup device according to an embodiment of the present invention and which includes a plurality of pixels integrated, and a pixel region $R_{PX}$ and a pad electrode region $R_{PAD}$ are shown.

For example, in the pixel region $R_{PX}$ serving as a light-receiving surface, an n-type charge-storage layer 11 and a $p^+$-type surface layer 12, which is a surface layer of the n-type charge-storage layer, are disposed on a pixel basis in a p-well region 10 of a semiconductor substrate, a photodiode PD is constructed by pn junction and, furthermore, a gate insulating film 13 and a gate electrode 14 are disposed adjacently to the photodiode PD on the semiconductor.

For example, a signal transferring portion, e.g., a floating diffusion and a CCD charge transfer line, for reading signal charges generated and stored in the photodiodes PD or voltages corresponding to the signal charges is disposed on the above-described semiconductor substrate, and signal charges are transferred by applying a voltage to the gate electrode 14.

An insulating film covering the photodiode PD is disposed on the semiconductor substrate. The insulating film is constructed by laminating a first insulating film 15, a second insulating film 16, a third insulating film 17, a fourth insulating film 21, a fifth insulating film 22, a sixth insulating film 26, a seventh insulating film 27, and an eighth insulating film 31, each formed from, for example, silicon oxide; a first diffusion-preventing film 20 and a second diffusion-preventing film 25, each formed from, for example, silicon carbide; and a third diffusion-preventing film 30 formed from, for example, silicon nitride.

A wiring groove 17t is disposed in the above-described third insulating film 17, and is filled with a first wiring layer formed by, for example, a damascene process and composed of a barrier metal layer 18 formed from tantalum/tantalum oxide and an electrically conductive layer 19 formed from copper.

Likewise, a second wiring layer composed of a barrier metal layer 23 and an electrically conductive layer 24 is disposed in a wiring groove 22t in the fifth insulating film 22. A wiring groove 27t is disposed in the seventh insulating film 27, and a third wiring layer composed of a barrier metal layer 28 and an electrically conductive layer 29 is disposed therein. The above-described first to third diffusion-preventing films prevent diffusion of copper constituting the electrically conductive layers (19, 24, 29).

In this manner, wiring layers are embedded in the above-described insulating films laminated. Each of the above-described first to third wirings may have a wiring structure formed integrally with a contact portion in a opening portion from a bottom of the wiring groove to a lower layer wiring by, for example, a dual damascene process.

In the pad electrode region $R_{PAD}$, a pad electrode 32 is disposed as a layer on the insulating film. The pad electrode 32 is formed from, for example, aluminum and is connected to the third wiring or the like through an opening portion 31c or the like disposed in the eighth insulating film 31 or the like. Regarding the size, for example, the diameter is about 100 μl.

Furthermore, a ninth insulating film 33 formed from silicon oxide is disposed all over the surface while covering the above-described pad electrode 32.

For example, in a portion above the photodiode PD, a concave portion H is disposed in the fourth to ninth insulating films and the first to third diffusion-preventing films formed by lamination as described above.

The insulating films laminated on the photodiode PD are configured to include the diffusion-preventing film of the wiring layer, as described above. For example, the first diffusion-preventing film 20 serving as the lowermost diffusion-preventing film constitutes the bottom of the concave portion H.

The above-described concave portion H has, for example, an opening diameter of about 0.8 μm and an aspect ratio of about 1 to 2 or more depending on the area and the pixel size of the photodiode, process rules, and the like.

For example, an inner wall of the concave portion H is a surface perpendicular to a main surface of the substrate, and a part of the ninth insulating film 33 serving as an edge part of the concave portion H is a reverse tapered opening shaped portion 33a which is divergent upwardly.

A passivation film 36 which covers the inner wall of the above-described concave portion H and which has a refractive index higher than that of silicon oxide (refractive index 1.45) is disposed as a layer above the pad electrode 32. The passivation film 36 is formed from, for example, silicon nitride (refractive index 2.0) and has a film thickness of about 0.5 μm.

For example, although the edge part of the opening takes the reverse tapered shape, regarding the profile, deposition is thick at the opening edge portion and deposition is thin in the vicinity of the bottom of the concave portion H due to the anisotropy during deposition.

For example, a core layer 37 having a refractive index higher than the refractive index of silicon oxide is disposed as a layer on the passivation film 36 while being filled in the concave portion H. The core layer 37 is filled in the concave portion H, and the film thickness outside the concave portion H is about 0.5 μm.

The core layer 37 is composed of a high-refractive index resin, e.g., a siloxane based resin (refractive index 1.7) or polyimide. The siloxane based resin is particularly preferable.

Furthermore, the above-described resin contains metal oxide fine particles of, e.g., titanium oxide, tantalum oxide, niobium oxide, tungsten oxide, zirconium oxide, zinc oxide, indium oxide, or hafnium oxide, so as to increase the refractive index.

A planarizing resin layer 38 also functioning as, for example, an adhesive layer is disposed as a layer on the above-described core layer 37. Color filters (39a, 39b, 39c) of, for example, blue (B), green (G), and red (R), respectively, are disposed thereon on a pixel basis, and a microlens 40 is disposed thereon.

No color filter is disposed in the pad electrode region $R_{PAD}$. The ninth insulating film 33, the passivation film 36, the core layer 37, the planarizing resin layer 38, and a resin layer 40a constituting the microlens are laminated as layers on the pad electrode 32, and an opening P is disposed in such a way as to expose an upper surface of the pad electrode 32.

Figure 2:
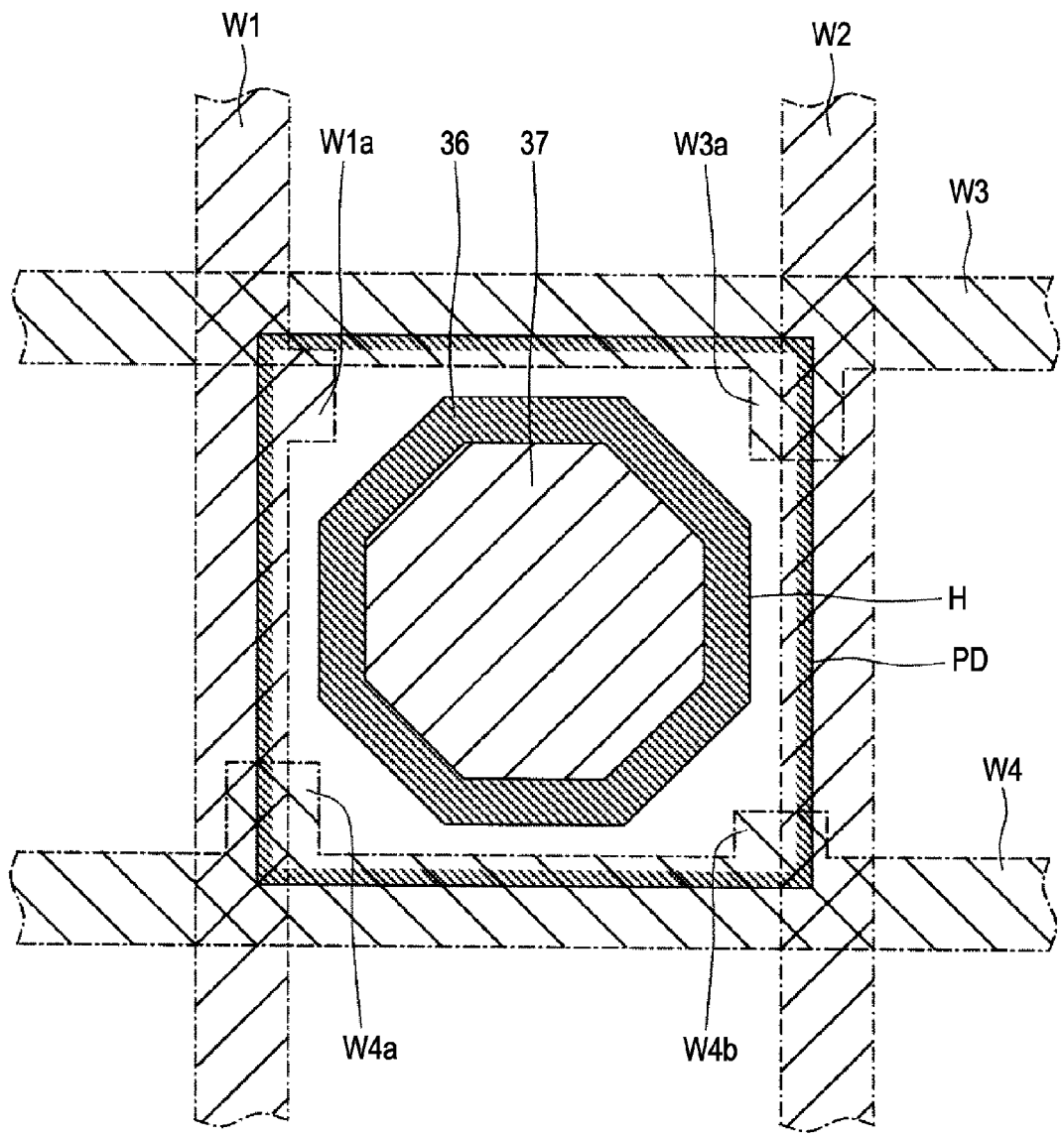
FIG. 2 is a schematic layout diagram of a pixel portion of the solid-state image pickup device according to the first embodiment of the present invention.

FIG. 2 is a schematic layout diagram of a pixel portion of the solid-state image pickup device according to the present embodiment.

The passivation film 36 and the core layer 37, which are formed from the high-refractive index substance and which are filled in the concave portion H, constitute an optical waveguide for guiding the light incident from the outside to the photodiode.

For example, the optical waveguide is disposed in a region smaller than the region of the photodiode PD.

The wiring layers, e.g., the first to third wiring layers as shown in FIG. 1 are disposed in the insulating films in such a way as to take the shape of a mesh surrounding the concave portion H. The term "shape of a mesh" indicates a state in which the wiring layers and the insulating films are vertically alternatively laminated. For example, the region of the concave portion H is set in the region surrounded by the wiring layers (W1, W2) extending in the vertical direction and the wiring layers (W3, W4) extending in the horizontal direction. Each of the wiring layers (W1, W2, W3, W4) has, for example, a structure in the shape of a mesh.

Figure 3:
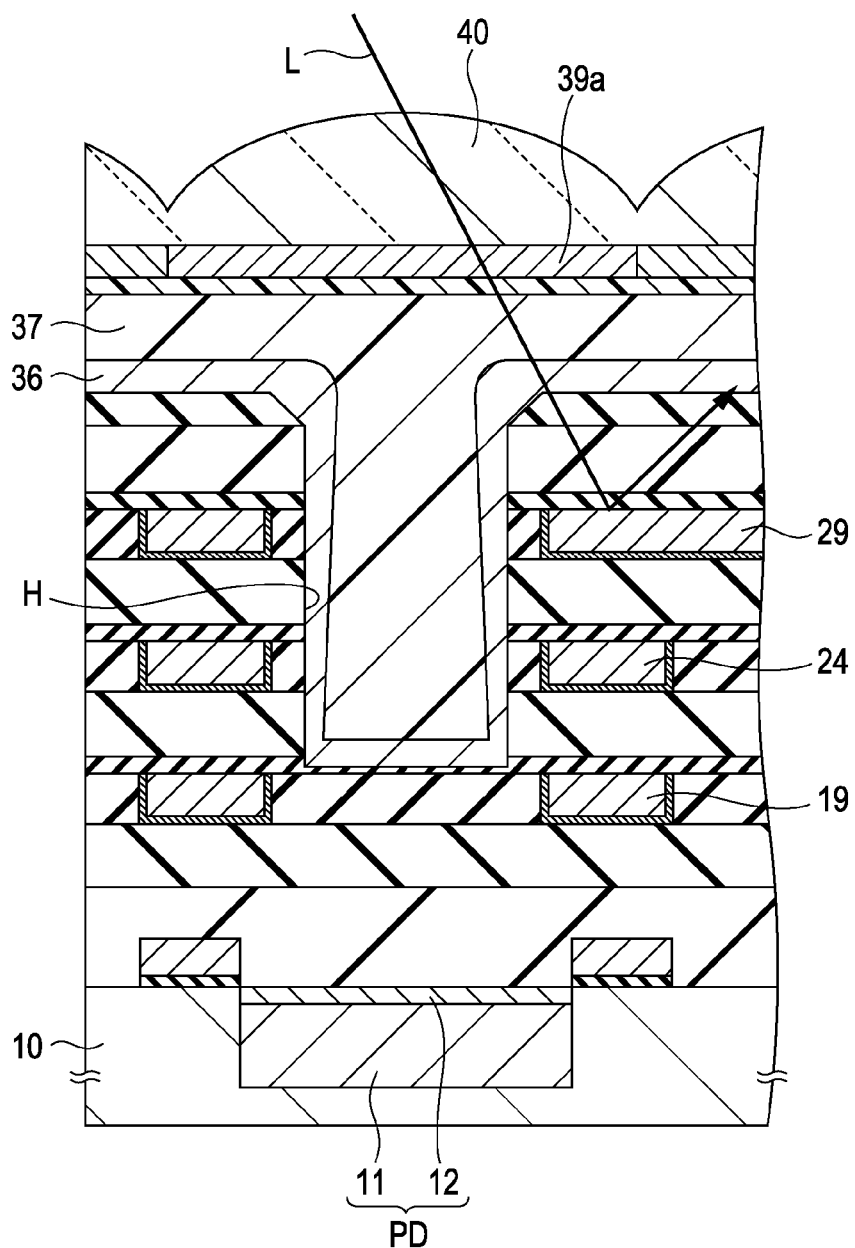
FIG. 3 is a schematic sectional view for explaining a route of light incident on a photodiode of the solid-state image pickup device according to the first embodiment of the present invention.

FIG. 3 is a schematic sectional view for explaining a route of light incident on the photodiode of the solid-state image pickup device according to the present embodiment.

For example, the light L incident by the route as shown in FIG. 3 enters obliquely and, therefore, does not enter the photodiode PD of the pixel, on which the light L is incident, but enters an adjacent pixel so as to cause color mixing.

However, in the case where the above-described mesh-shaped wiring layers are disposed around the above-described optical waveguide, the light, which is likely to leak to the adjacent pixel, is reflected and, thereby, entrance into the photodiode of the adjacent pixel can be prevented.

Furthermore, for example, as shown in FIG. 2, in the case where the region of the concave portion H is laid out in the region surrounded by the above-described wiring layers (W1, W2, W3, W4), it is preferable that the area is not overlapped with the wiring layers (W1, W2, W3, W4) and is set at the maximum in order to increase the incident efficiency of the light.

However, in the above-described wiring layers (W1, W2, W3, W4), regions (W1a, W3a, W4a, W4b) protruding toward the region for the concave portion H are usually present. Therefore, the region for the concave portion H needs to avoid these regions.

In the present embodiment, layout is performed in such a way that the shape of cross-section of the concave portion H in a plane parallel to a main surface of the semiconductor substrate takes an angular and/or curved shape having simply outward-convex components in the region avoiding the above-described protrusion regions of the wiring layers.

Here, an angular shape having simply outward-convex components refers to the angular shape having interior angles not exceeding 180 degrees, where angular shapes, in which a corner edge is rounded, are also included.

A curved shape having simply outward-convex components refers to the curved shape, in which every tangent at all points on the curve does not cross the shape and always present outside the shape except the point of contact, where a circle, an ellipse, and the like are included.

The shape may be a combination of a part of the angular shape having simply outward-convex components and a part of the curved shape having simply outward-convex components.

In the present embodiment, preferably, the area of the concave portion H satisfying the above-described constraint that the shape has simply outward-convex components is set at the maximum without overlapping the wiring layers which are embedded in the insulating films in such a way as to surround the concave portion.

FIGS. 4A to 4G are schematic diagrams showing examples of the shapes of concave portions H of the solid-state image pickup device according to the first embodiment of the present invention. The inside of the angular shape is diagonally shaped.

Figure 4A:
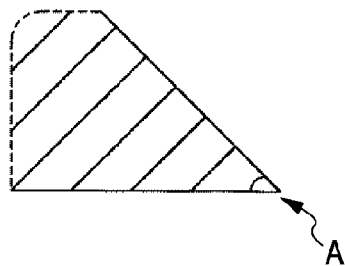
FIGS. 4A to 4G are schematic diagrams showing examples of the shapes of concave portions of the solid-state image pickup device according to the first embodiment of the present invention.
Figure 4B:
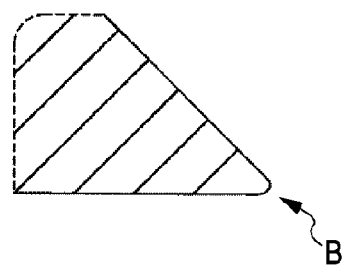

FIG. 4A shows an angular shape A having an interior angle of about 45 degrees that does not exceed 180 degrees. FIG. 4B shows an angular shape B which is the angular shape shown in FIG. 4A having a rounded corner edge.

Figure 4C:
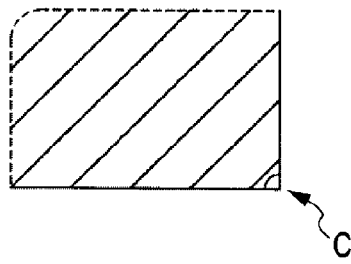
Figure 4D:
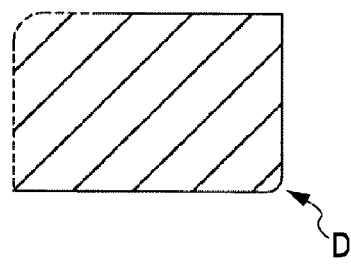

FIG. 4C shows an angular shape C having an interior angle of about 90 degrees that does not exceed 180 degrees. FIG. 4D shows an angular shape D which is the angular shape shown in FIG. 4C having a rounded corner edge.

Figure 4E:
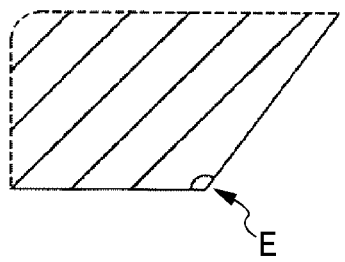
Figure 4F:
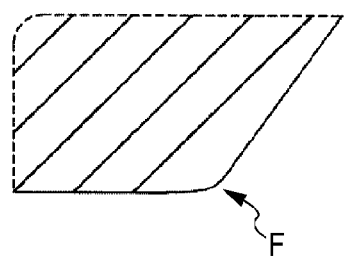

FIG. 4E shows an angular shape E having an interior angle of about 135 degrees that does not exceed 180 degrees. FIG. 4F shows an angular shape F which is the angular shape shown in FIG. 4E having a rounded corner edge.

The shape is allowed to have simply outward-convex components, as described above.

Figure 4G:
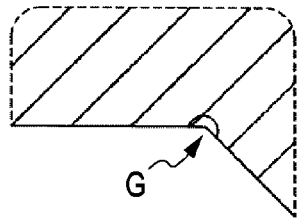

On the other hand, an angular shape G as shown in FIG. 4G has an interior angle exceeding 180 degrees. Such a shape does not have simply outward-convex components. A shape having such an angular shape is not adopted in the present invention.

For example, if an inward-convex angular shape is present, cracking easily occurs from such a point in the high-refractive index resin, e.g., a siloxane based resin, filled in the concave portion H.

Therefore, by allowing the shape of the concave portion H to take an angular and/or curved shape having simply outward-convex components, as described above, an occurrence of cracking in the core layer 37 filled in the concave portion H can be suppressed, and deterioration of the sensitivity and an occurrence of noise can be reduced.

In the above-described solid-state image pickup device according to an embodiment of the present invention, the concave portion H is disposed above the photodiode and in the insulating film disposed as the layer on the photodiode, and the optical waveguide is constructed by filling the concave portion H with the high-refractive index substance. The passivation film disposed as the layer on the pad electrode is also used as the high-refractive index substance filled in the concave portion. Consequently, the configuration can be produced by a simpler process even when the optical waveguide is disposed.

In the solid-state image pickup device according to an embodiment of the present invention, for example, logic circuits and the like can be mounted together on the same chip. In this case, the above-described passivation film constituting the optical waveguide is also used as a passivation film in the logic and other regions.

According to the solid-state image pickup device according to an embodiment of the present invention, since the optical waveguide structure is adopted as described above, the sensitivity is increased, and shading can be reduced. Furthermore, the color mixing characteristics can be improved by using the wiring layers as light-shielding film patterns for adjacent pixels.

A method for manufacturing a solid-state image pickup device according to an embodiment of the present invention will be described below with reference to the drawings.

Figure 5A:
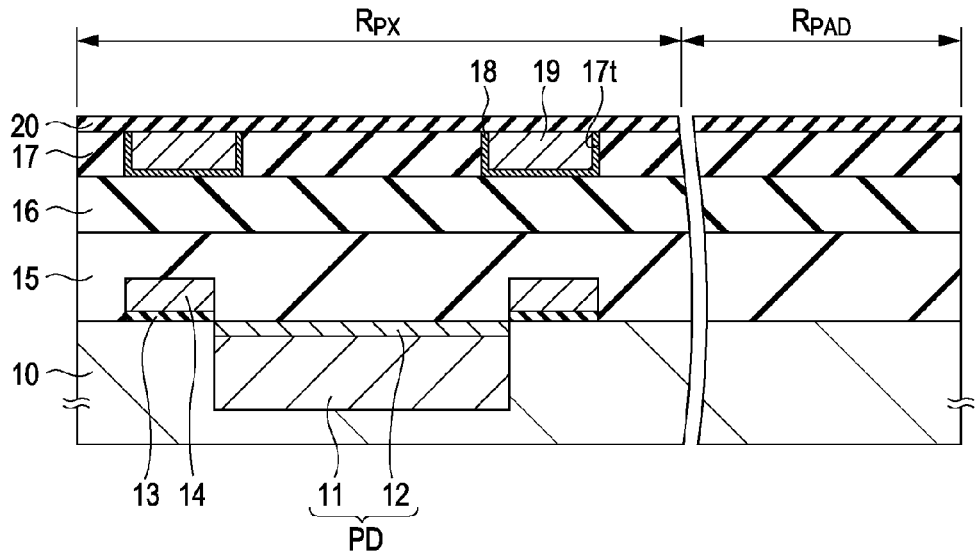
FIGS. 5A and 5B are sectional views showing a production process of a method for manufacturing the solid-state image pickup device according to the first embodiment of the present invention.

As shown in FIG. 5A, for example, in the pixel region $R_{PX}$, an n-type charge-storage layer 11 and a p$^+$-type surface layer 12, which is a surface layer of the n-type charge-storage layer, are formed in a p-well region 10 of a semiconductor substrate, so as to constitute a photodiode PD having pn junction. A gate insulating film 13, a gate electrode 14, and a signal transferring portion, e.g., floating diffusion and a CCD charge transfer line, for reading signal charges generated and stored in the photodiode or voltages corresponding to the signal charges are formed adjacently to the photodiode PD.

For example, silicon oxide is deposited by a chemical vapor deposition (CVD) method all over the pixel region $R_{PX}$ and the pad electrode region $R_{PAD}$ while covering the photodiode PD so as to form the first insulating film 15.

For example, silicon oxide is deposited as a layer on the first insulating film 15 so as to form the second insulating film 16, and silicon oxide is further deposited so as to form the third insulating film 17.

For example, a wiring groove 17t is formed in the third insulating film 17 by etching. Furthermore, a film of tantalum/tantalum oxide is formed covering the inner wall of the wiring groove 17t by sputtering so as to form the barrier metal layer 18. A copper seed layer is formed, a film of copper is formed all over the surface by an electrolytic plating treatment, and copper formed outside the wiring groove 17t is removed by a chemical mechanical polishing (CMP) method or the like so as to form the electrically conductive layer 19. At this time, the barrier metal layer 18 formed outside the wiring groove 17t is also removed. In this manner, the first wiring layer composed of barrier metal layer 18 and the electrically conductive layer 19 filled in the wiring groove 17t is formed.

For example, silicon carbide is deposited as a layer on the first wiring layer by the CVD method so as to form the first diffusion-preventing film 20.

Figure 5B:
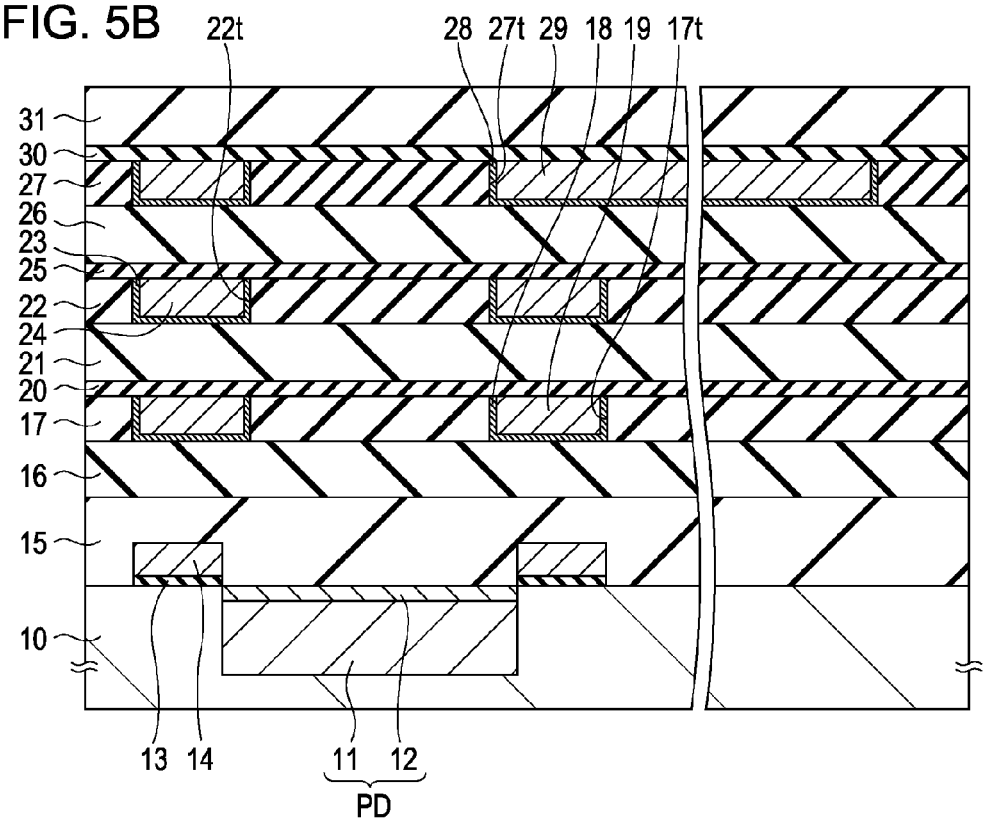

As shown in FIG. 5B, the above-described process for forming the second insulating film 16, the third insulating film 17, the wiring groove 17t, the second wiring layer composed of the barrier metal layer 18 and the electrically conductive layer 19, and the first diffusion-preventing film 20 is repeated and, thereby, for example, the fourth insulating film 21, the fifth insulating film 22, the wiring groove 22t, the barrier metal layer 23, the electrically conductive layer 24, and the second diffusion-preventing film 25 are formed. Furthermore, the sixth insulating film 26, the seventh insulating film 27, the wiring groove 27t, the third wiring layer composed of the barrier metal layer 28 and the electrically conductive layer 29 are formed. Silicon nitride is further deposited by, for example, the CVD method so as to form the third diffusion-preventing film 30. Moreover, the eighth insulating film 31 is formed as a layer thereon.

As described above, the insulating film, in which the first insulating film 15, the second insulating film 16, the third insulating film 17, the fourth insulating film 21, the fifth insulating film 22, the sixth insulating film 26, the seventh insulating film 27, and the eighth insulating film 31; the first diffusion-preventing film 20 and the second diffusion-preventing film 25, each formed from, for example, silicon carbide; and the third diffusion-preventing film 30 formed from, for example, silicon nitride are laminated, and the first to third wiring layers, which are embedded in the insulating films, are formed.

Here, the above-described third wiring layer is formed in such a way as to extend to the pad electrode region $R_{PAD}$.

For each of the above-described first to third wirings, a wiring structure may be formed integrally with the contact portion in the opening portion from the bottom of the wiring groove to the lower layer wiring by, for example, a dual damascene process.

As shown in FIG. 6A, the opening portion 31c reaching the third wiring layer is formed in the eighth insulating layer 31 and the like. A film of aluminum is formed by a sputtering method or the like at a film formation temperature of, for example, about 300° C. and, thereafter, patterning is performed so as to form the pad electrode 32 having a diameter of, for example, about 100 µm.

All the steps after formation of the aluminum pad electrode 32 are allowed to be processes at 400° C. or lower.

As shown in FIG. 6B, for example, silicon oxide is deposited all over the pixel region $R_{PX}$ and the pad electrode region $R_{PAD}$ by the CVD method while covering the pad electrode 32 so as to form the ninth insulating film 33.

Figure 7:
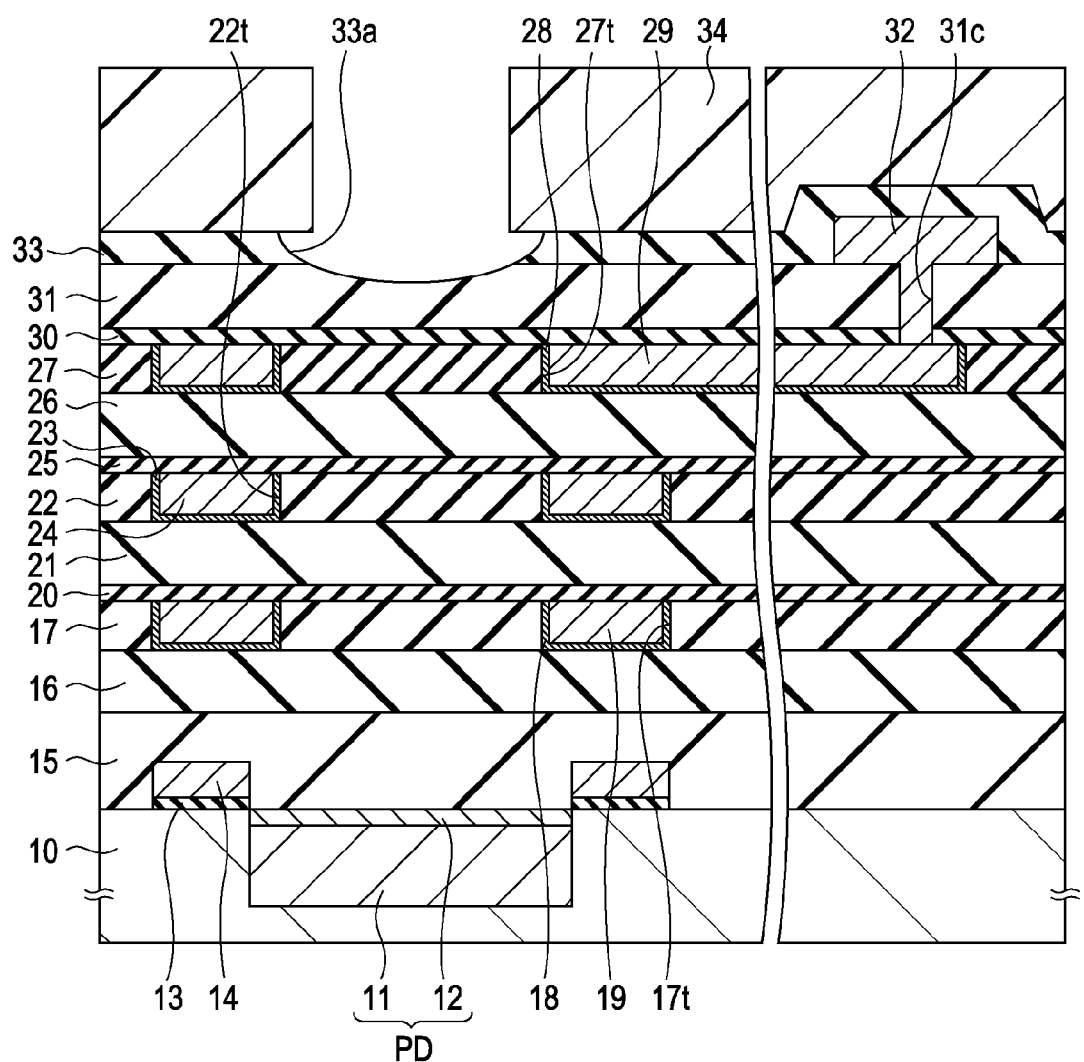
FIG. 7 is a sectional view showing a production process of a method for manufacturing the solid-state image pickup device according to the first embodiment of the present invention.

As shown in FIG. 7, for example, a resist film 34 with a pattern for opening the concave portion H is patterned by a photolithography step, and etching, e.g., chemical dry etching or other isotropic etching, anisotropic etching, or the like is performed so as to form the reverse tapered opening shaped portion 33a, which is divergent upwardly, in the ninth insulating film 33.

Figure 8:
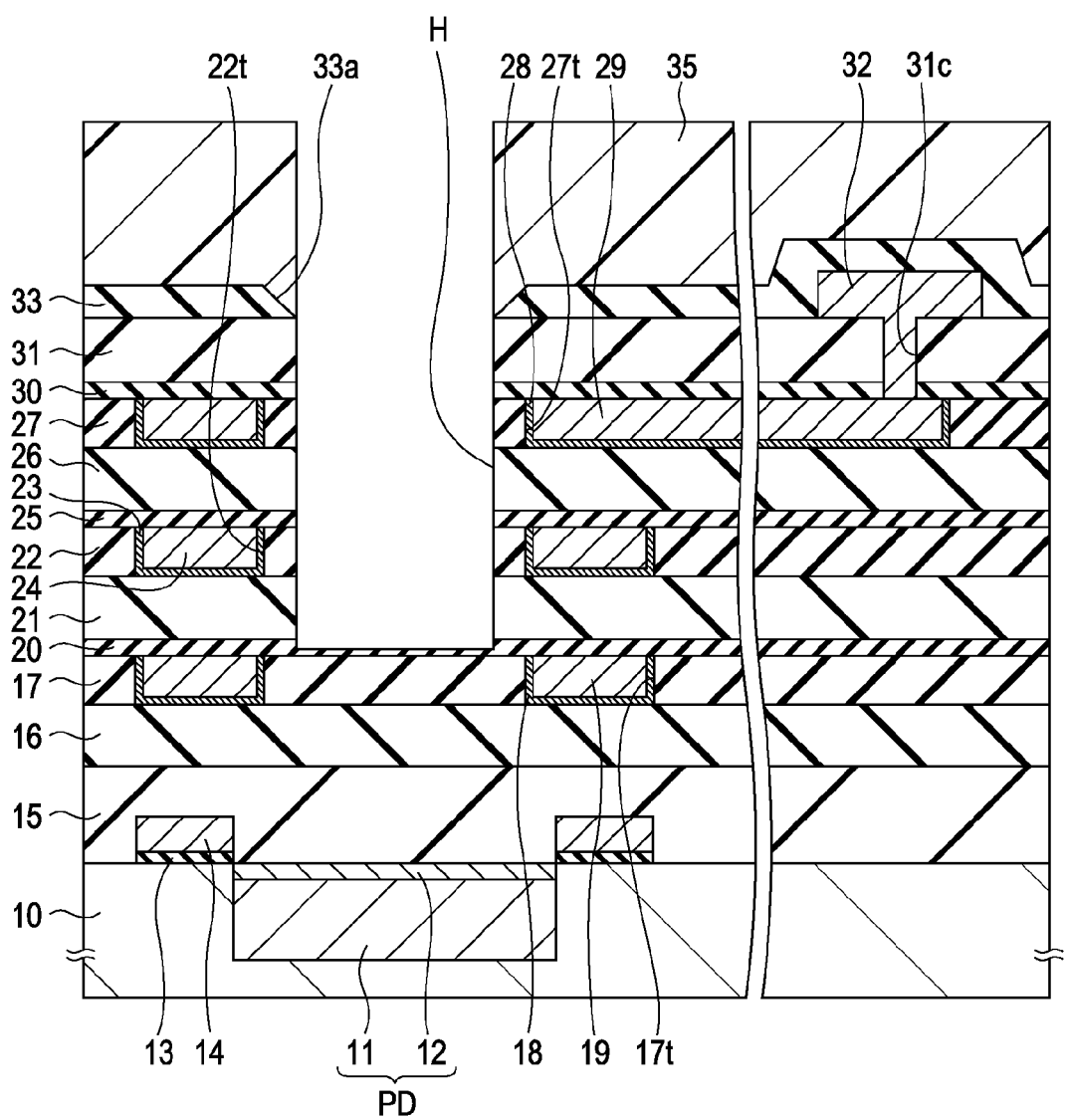
FIG. 8 is a sectional view showing a production process of a method for manufacturing the solid-state image pickup device according to the first embodiment of the present invention.

The above-described resist film 34 is removed. As shown in FIG. 8, for example, a resist film 35 with the same pattern as that of the resist film 34 is formed by patterning. Anisotropic etching, e.g., reactive ion etching is performed so as to form the concave portion H in the fourth to ninth insulating films and the first to third diffusion-preventing films.

In opening the above-described concave portion H, for example, etching is allowed to proceed while the condition is changed depending on the materials, e.g., silicon oxide, silicon nitride, and silicon carbide, and when the bottom of the opening reaches the first diffusion-preventing film 20, etching is allowed to stop promptly.

In this manner, the first diffusion-preventing film 20 is allowed to constitute the bottom of the concave portion H.

Since the first diffusion-preventing film 20 serves as the bottom of the concave portion H, as described above, the depth of the concave portion H can be determined stably. Consequently, the distance between the photodiode and the optical waveguide becomes constant and, thereby, occurrence of variations in the characteristics can be prevented.

As described above, the concave portion H can be opened. For example, the opening diameter is about 0.8 µl, the aspect ratio is about 1 to 2 or more, and the edge part of the concave portion H is a part of the ninth insulating film 33 and is a reverse tapered opening shaped portion 33a.

Figure 9:
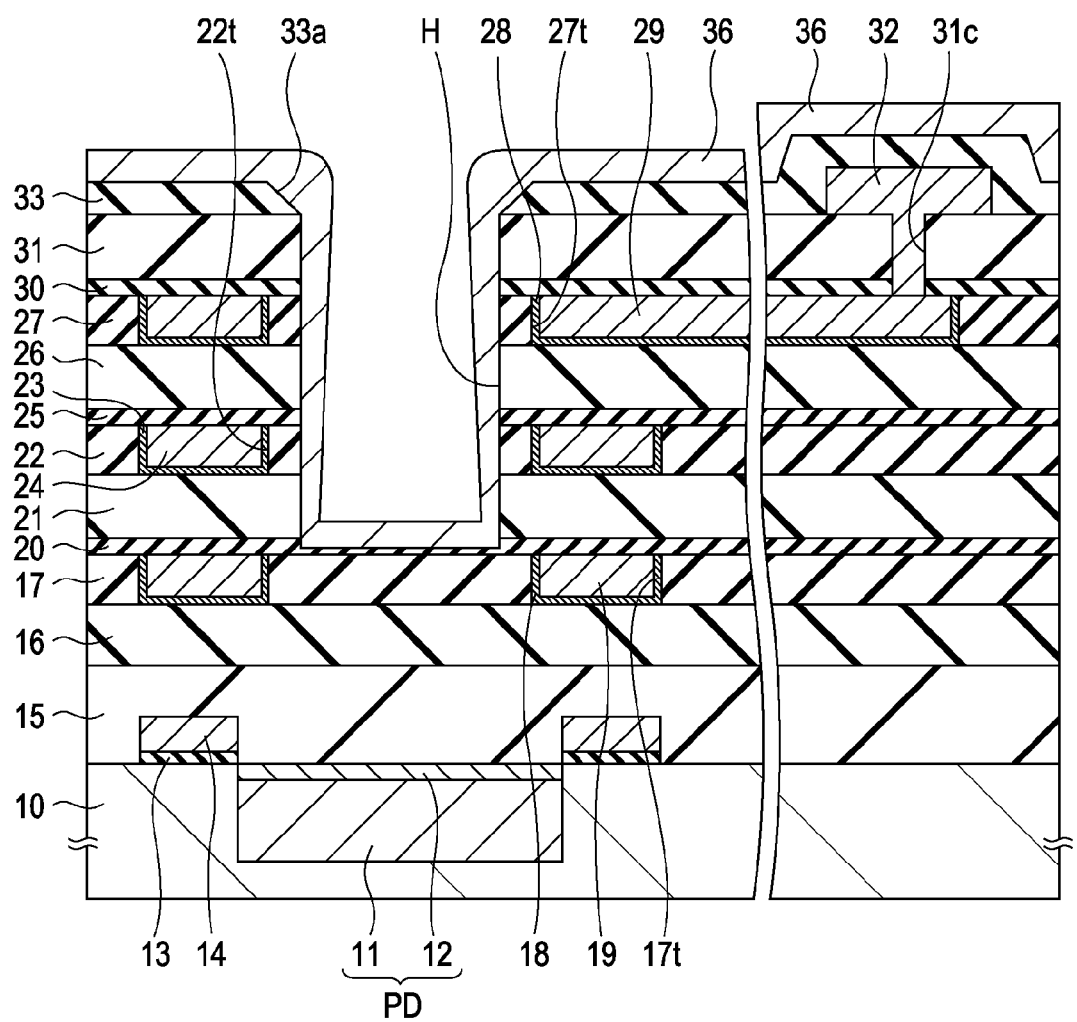
FIG. 9 is a sectional view showing a production process of a method for manufacturing the solid-state image pickup device according to the first embodiment of the present invention.

As shown in FIG. 9, silicon nitride having a refractive index higher than that of silicon oxide is deposited as a layer above the pad electrode 32 while covering the inner wall of the concave portion H by, for example, a plasma CVD method at a film formation temperature of about 380° C., so as to form the passivation film 36 having a film thickness of about 0.5 µl. The edge part of the opening takes the reverse tapered shape. However, regarding the profile, deposition is thick at the opening edge portion and deposition is thin in the vicinity of the bottom of the concave portion H due to the anisotropy during deposition.

Figure 10:
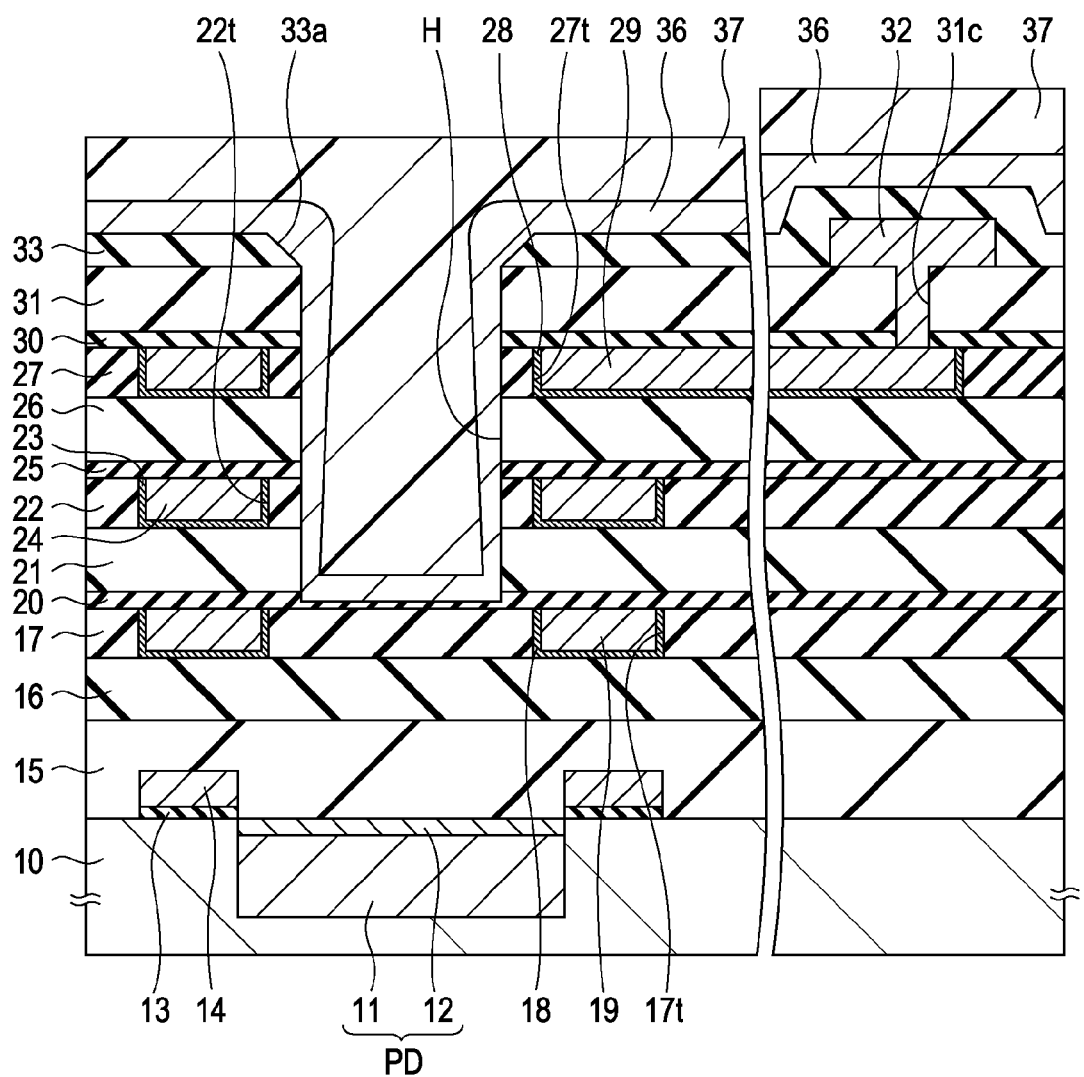
FIG. 10 is a sectional view showing a production process of a method for manufacturing the solid-state image pickup device according to the first embodiment of the present invention.

As shown in FIG. 10, a film of siloxane based resin containing metal oxide fine particles, e.g., titanium oxide, and having a film thickness of about 0.5 µm is formed by, for example, a spin coating method at a film formation temperature of about 400° C., and is filled in the concave portion H as a layer on the passivation film 36, so as to form the core layer 37 having a refractive index higher than that of silicon oxide. After coating, for example, a post bake treatment is performed at about 300° C., if necessary. In the case where a polyimide resin is used, a film can be formed at a temperature of, for example, about 350° C.

Figure 11:
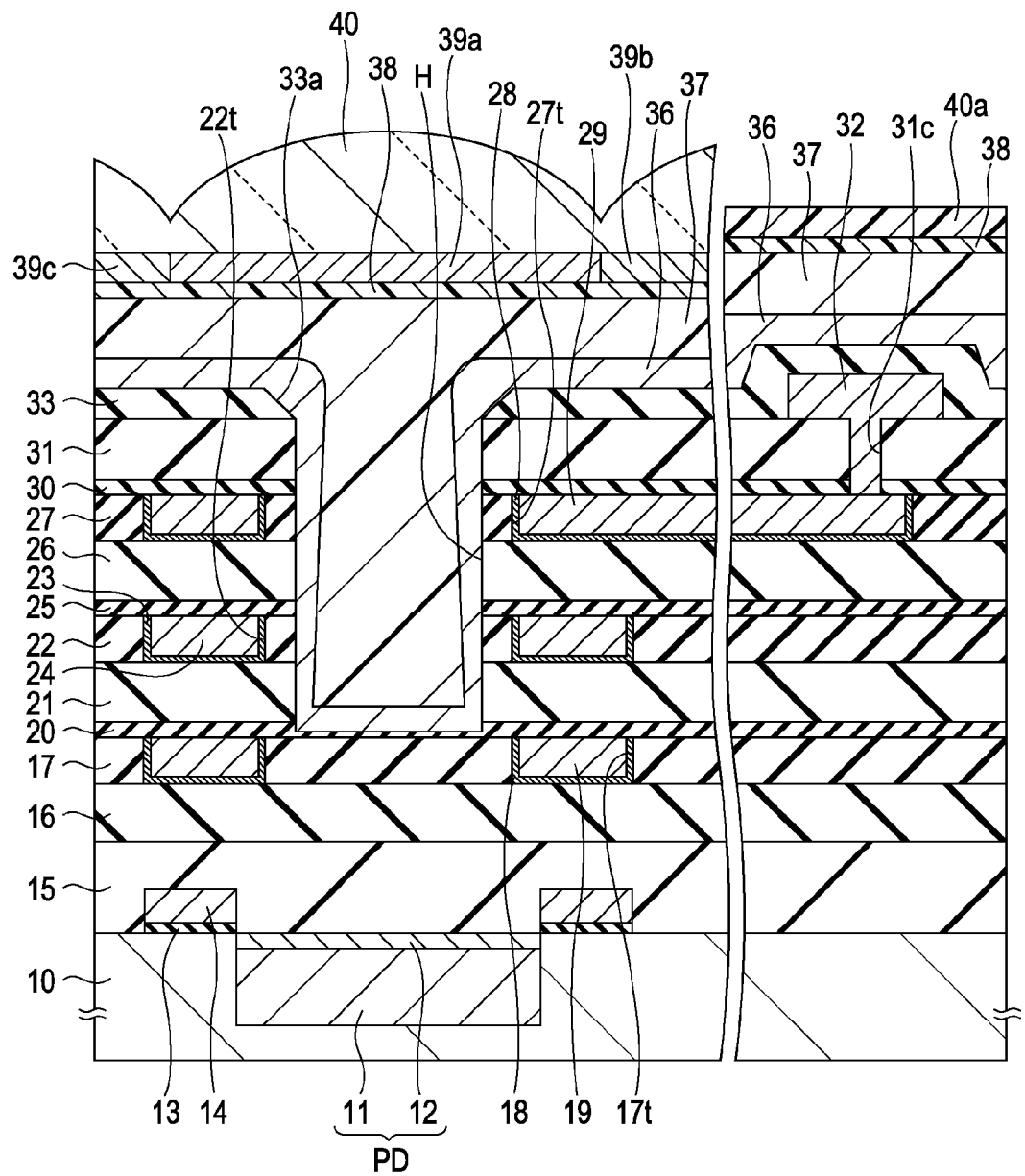
FIG. 11 is a sectional view showing a production process of a method for manufacturing the solid-state image pickup device according to the first embodiment of the present invention.

As shown in FIG. 11, the planarizing resin layer 38 also functioning as, for example, an adhesive layer is formed as a layer on the core layer 37. Color filters (39a, 39b, 39c) of, for example, blue (B), green (G), and red (R), respectively, are formed as a layer thereon on a pixel basis.

The microlens 40 is further formed as a layer thereon.

In the above-described manufacturing method, a hydrogen treatment (sintering) for terminating dangling bonds in the semiconductor can be performed in any step, for example, after the forming of pad electrode and before the filling of resin core layer.

Furthermore, as shown in FIG. 1, in the pad electrode region $R_{PAD}$, an opening P is formed in such a way as to expose the upper surface of the pad electrode 32.

In this manner, the solid-state image pickup device having the configuration as shown in FIG. 1 can be produced.

In the method for manufacturing a solid-state image pickup device according to the present embodiment, the passivation film formed as the layer on the pad electrode is also used as the high-refractive index substance to be filled in the concave portions H. Therefore, the production can be performed by a simpler process even when the optical waveguide is disposed.

Second Embodiment

Figure 12:
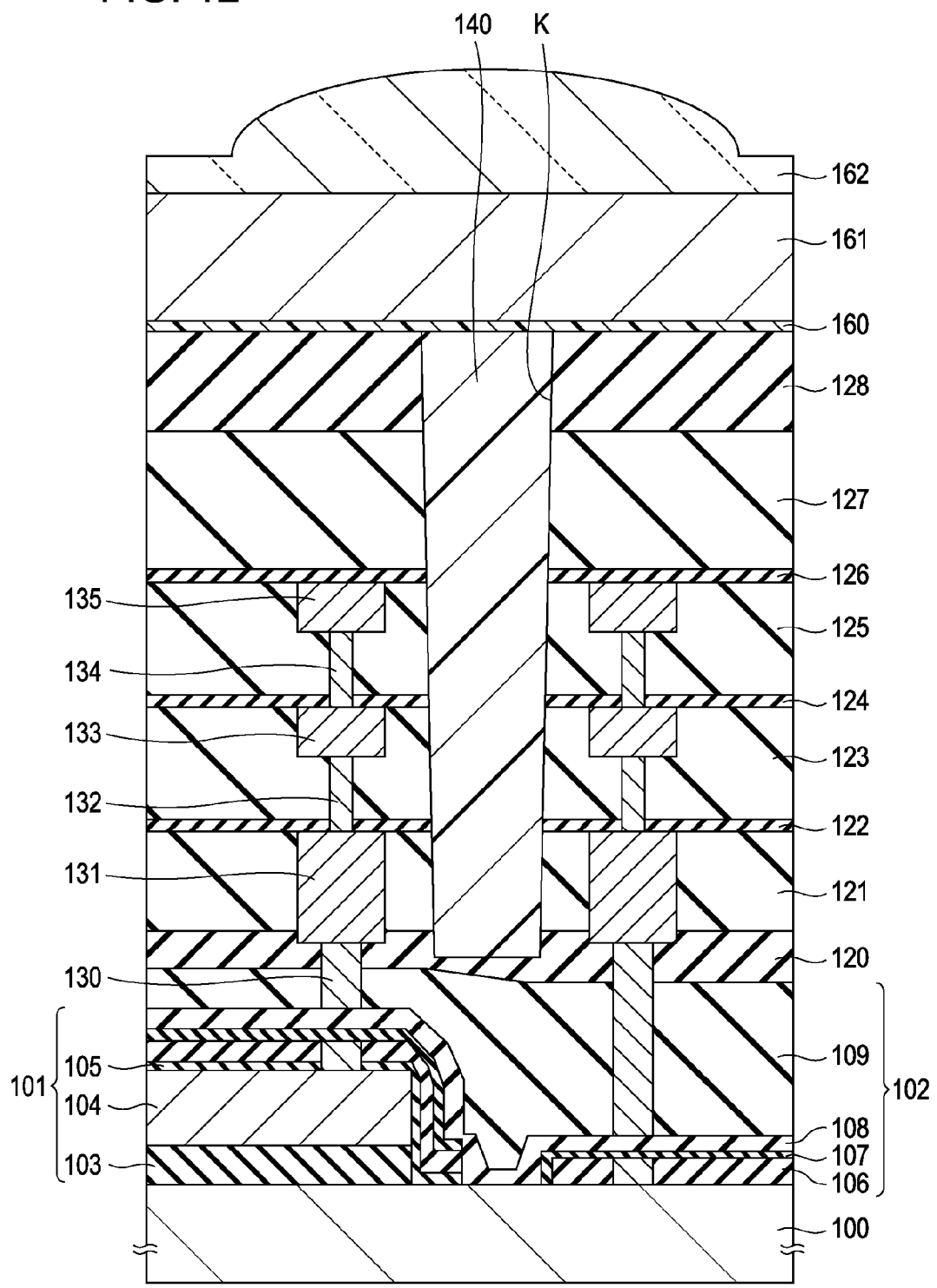
FIG. 12 is a sectional view of a solid-state image pickup device according to a second embodiment of the present invention.

FIG. 12 is a schematic sectional view showing the configuration of a CMO sensor which is a solid-state image pickup device according to an embodiment of the present invention.

For example, a sensor portion 102 including a light-receiving portion 101 for photoelectric conversion of light and a first insulating film 109, which covers the light-receiving portion 101 and which is formed from, for example, silicon oxide, are disposed on a semiconductor substrate 100. A second insulating film 120, a third insulating film 121, a fourth insulating film 123, and a fifth insulating film 125, which are formed from, for example, silicon oxide, are disposed on this sensor portion 102. A first wiring layer 131, a second wiring layer 133, and a third wiring layer 135, each formed by, for example, a damascene process and composed of a barrier metal layer, although not shown in the drawing, formed from tantalum/tantalum oxide and copper, are disposed in these second insulating film 120, third insulating film 121, fourth insulating film 123, and fifth insulating film 125. The first wiring layer 131 is electrically connected to the light-receiving portion 101 through a contact plug 130 formed by, for example, the damascene process, and each wiring is electrically connected to each other through a first via plug 132 and a second via plug 134 formed by, for example, the damascene process. A first diffusion-preventing film 122 and a second diffusion-preventing film 124, which are formed from, for example, silicon carbide having a film thickness of about 50 nm, are disposed between the third insulating film 121, the fourth insulating film 123, and the fifth insulating film 125. A third diffusion-preventing film 126 formed from, for example, silicon nitride is disposed on the fifth insulating film 125. Consequently, diffusion of copper constituting the first wiring layer 131, the second wiring layer 133, and the third wiring layer 135 is prevented.

The above-described first to third wiring (131, 133, 135) may be wiring structures formed integrally with the contact plug 130, the first via plug 132, and the second via plug 134, respectively, by the damascene process, for example.

The light-receiving portion 101 is composed of, for example, a gate insulating film 103 formed from silicon oxide, a gate electrode 104 formed from polysilicon, and insulating films (105, 106, 107, 108) formed from silicon nitride.

A sixth insulating film 127 formed from silicon oxide and a seventh insulating film 128 serving as a protective film are disposed on the third diffusion-preventing film 126.

Here, for example, in the portion above the light-receiving portion 101, a concave portion K is disposed in the third insulating film 121, the fourth insulating film 123, the fifth insulating film 125, the sixth insulating film 127, and the seventh insulating film 128; and the first diffusion-preventing film 122, the second diffusion-preventing film 124, and the third diffusion-preventing film 126 between the insulating films, which are disposed by lamination as described above.

The above-described concave portion K has, for example, an opening diameter of about 0.8 µm and an aspect ratio of about 1 to 2 or more depending on the area and the pixel size of the light-receiving portion 101, process rules, and the like.

For example, a core layer 140 composed of an inorganic substance having the heat resistance higher than the heat resistance of a TiO-dispersion organic resin and a metal oxide is disposed while being filled in the concave portion K. The core layer 140 serves as an optical waveguide. The inside of the concave portion K is filled with the core layer 140.

The core layer 140 is formed from an inorganic substance, for example, an oxide, e.g., silicon oxide, which has high heat resistance and which contains metal oxide fine particles of, e.g., titanium oxide, tantalum oxide, niobium oxide, tungsten oxide, zirconium oxide, zinc oxide, indium oxide, or hafnium oxide through ion-implantation. In particular, silicon oxide is preferable as the inorganic substance and titanium oxide is preferable as the metal oxide.

A planarizing resin layer 160 also functioning as, for example, an adhesive layer formed from an acrylic thermosetting resin or the like is disposed as a layer on the above-described core layer 140. A color filter 161 is disposed as a layer thereon, and a microlens 162, which is an optical element for condensing the incident light, is disposed as a layer thereon.

In the CMOS sensor having the above-described configuration, the incident light is condensed by the microlens 162, and is applied to the light-receiving portion 101 through the core layer 140 serving as the optical waveguide formed from the inorganic substance and the metal oxide, so as to be subjected to photoelectric conversion in the light-receiving portion 101.

A method for manufacturing a solid-state image pickup device according to an embodiment of the present invention will be described below with reference to the drawings.

Figure 13:
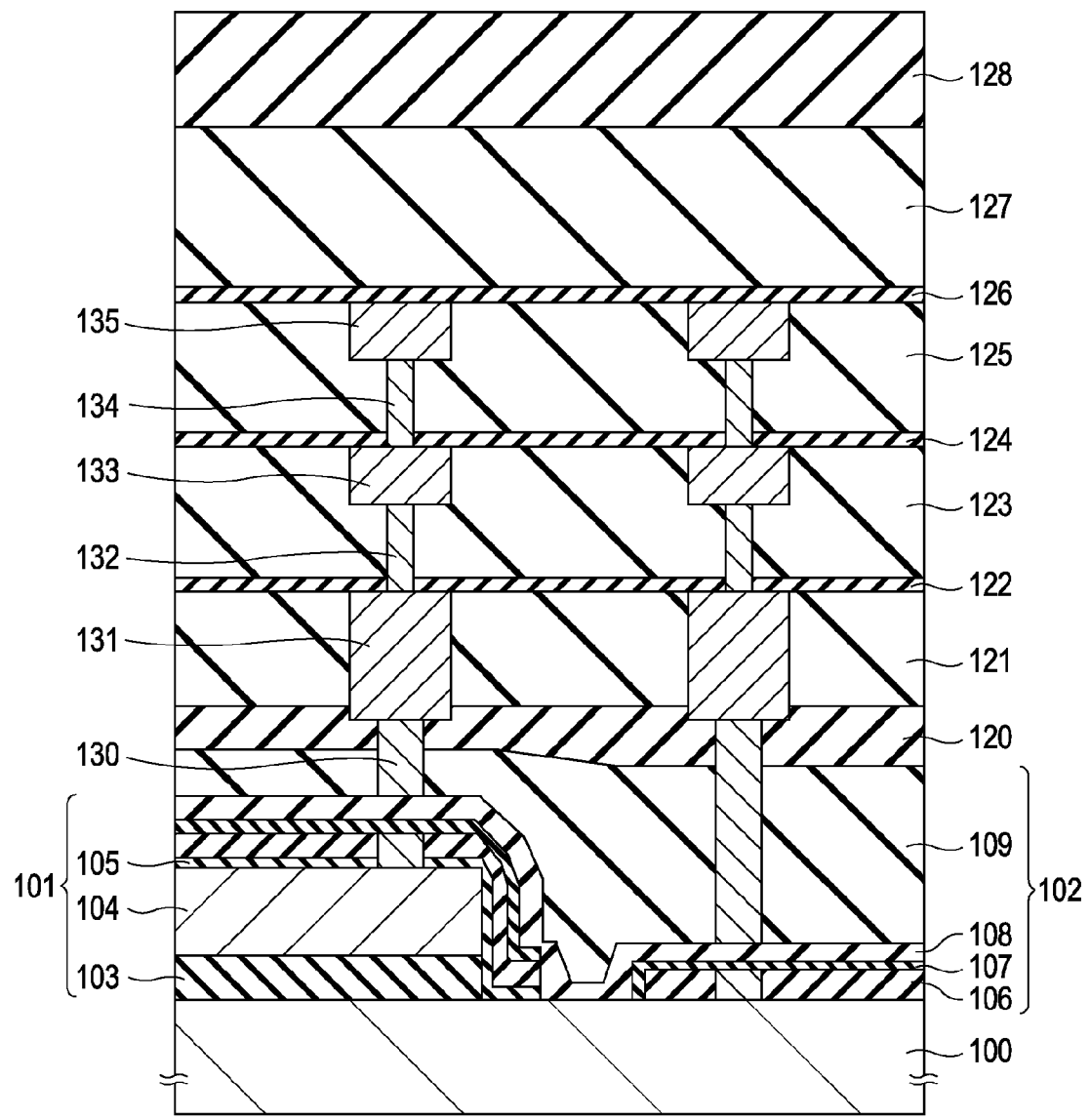
FIG. 13 is a sectional view showing a production process of a method for manufacturing the solid-state image pickup device according to the second embodiment of the present invention.

As shown in FIG. 13, a gate insulating film 103 formed from silicon oxide and a gate electrode 104 formed from polysilicon are formed as the light-receiving portion 101 on the semiconductor substrate 100. The insulating films (105, 106, 107, 108) formed from silicon nitride are formed above them.

Silicon oxide is deposited all over the light-receiving portion 101 by, for example, CVD so as to form the first insulating film 109 is formed on the light-receiving portion 101 and, thereby, the sensor portion 102 is produced.

Silicon oxide is deposited by CVD or the like so as to form the second insulating film 120 and the third insulating film 121. A groove for the contact plug 130 is formed in the second insulating film 120 and the third insulating film 121 by etching. A film of tantalum/tantalum oxide is formed covering the inner wall of the groove for the contact plug 130 by sputtering so as to form a barrier metal layer, although not shown in the drawing. A copper seed layer is formed, and a film of copper is formed all over the surface by an electrolytic plating treatment, so as to form the contact plug 130.

A groove for the first wiring layer 131 is formed on the contact plug 130. Furthermore, a film of tantalum/tantalum oxide is formed covering the inner wall of the groove for the first wiring layer 131 by sputtering so as to form a barrier metal layer, although not shown in the drawing. A copper seed layer is formed, a film of copper is formed all over the surface by an electrolytic plating treatment, and copper formed outside the groove for the first wiring layer 131 is removed by a chemical mechanical polishing (CMP) method or the like, so as to form the first wiring layer 131. In this manner, the contact plug 130 and the first wiring layer 131 are formed.

Silicon carbide is deposited as a layer on the first wiring layer 131 by, for example, CVD so as to form the first diffusion-preventing film 122.

Silicon oxide is deposited all over the first diffusion-preventing film 122 by using, for example, tetra ethyl ortho silicate (TEOS) through CVD or the like so as to form the fourth insulating film 123.

The above-described process for forming the second insulating film 120, the third insulating film 121, the fourth insulating film 123, the contact plug 130, the first wiring layer 131, and the first diffusion-preventing film 122 is repeated and, thereby, the first via plug 132, the second wiring layer 133, and the second diffusion-preventing film 124 are formed. Furthermore, the fifth insulating film 125, the second via plug 134, the third wiring layer 135, the third diffusion-preventing film 126, and the sixth insulating film 127 are formed. The seventh insulating film 128 formed from silicon oxide is formed thereon through, for example, CVD.

As described above, the second insulating film 120, the third insulating film 121, the fourth insulating film 123, the fifth insulating film 125, the sixth insulating film 127, and the seventh insulating film 128; the first diffusion-preventing film 122 and the second diffusion-preventing film 124, each formed from, for example, silicon carbide and disposed between the insulating films; the third diffusion-preventing film 126 formed from, for example, silicon nitride, and disposed between the insulating films; the first to third wiring layers (131, 133, 135), which are embedded in the insulating films; and the first via plug 132 and the second via plug 134 are formed.

The above-described first to third wirings (131, 133, 135) may be wiring structures formed integrally with the contact plug 130, the first via plug 132, and the second via plug 134, respectively, in the opening portion from the bottom of the wiring groove to the lower layer wiring by, for example, the dual damascene process.

Figure 14:
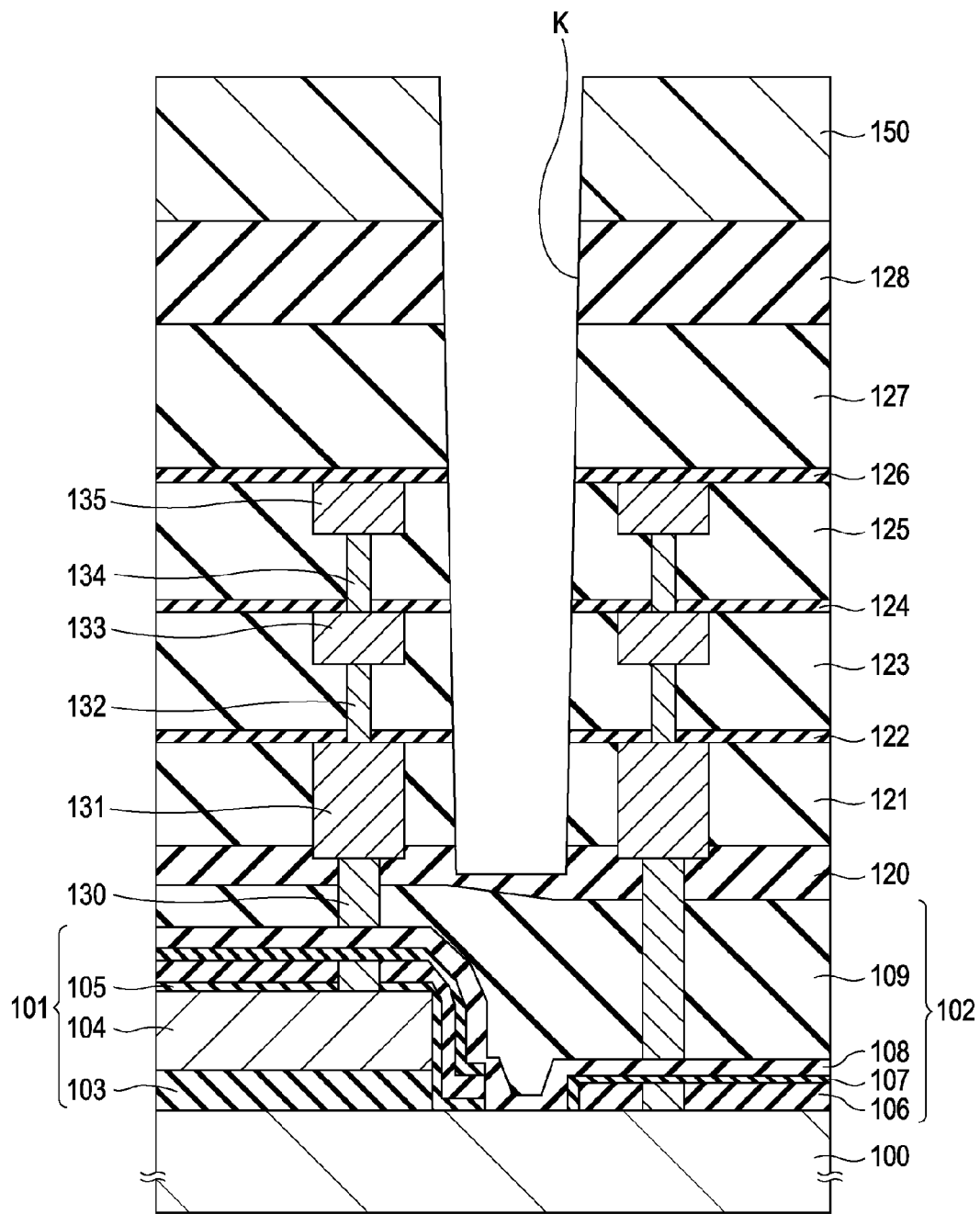
FIG. 14 is a sectional view showing a production process of a method for manufacturing the solid-state image pickup device according to the second embodiment of the present invention.

As shown in FIG. 14, for example, a resist film 150 with a pattern for opening the concave portion K is patterned by a photolithography step, and anisotropic etching, e.g., reactive ion etching, is performed so as to form the concave portion K in the second to seventh insulating films (120, 121, 123, 125, 127, 128) and the first to third diffusion-preventing films (131, 133, 135). For example, etching is allowed to proceed while the condition is changed depending on the materials, e.g., silicon oxide, silicon nitride, and silicon carbide.

Figure 15:
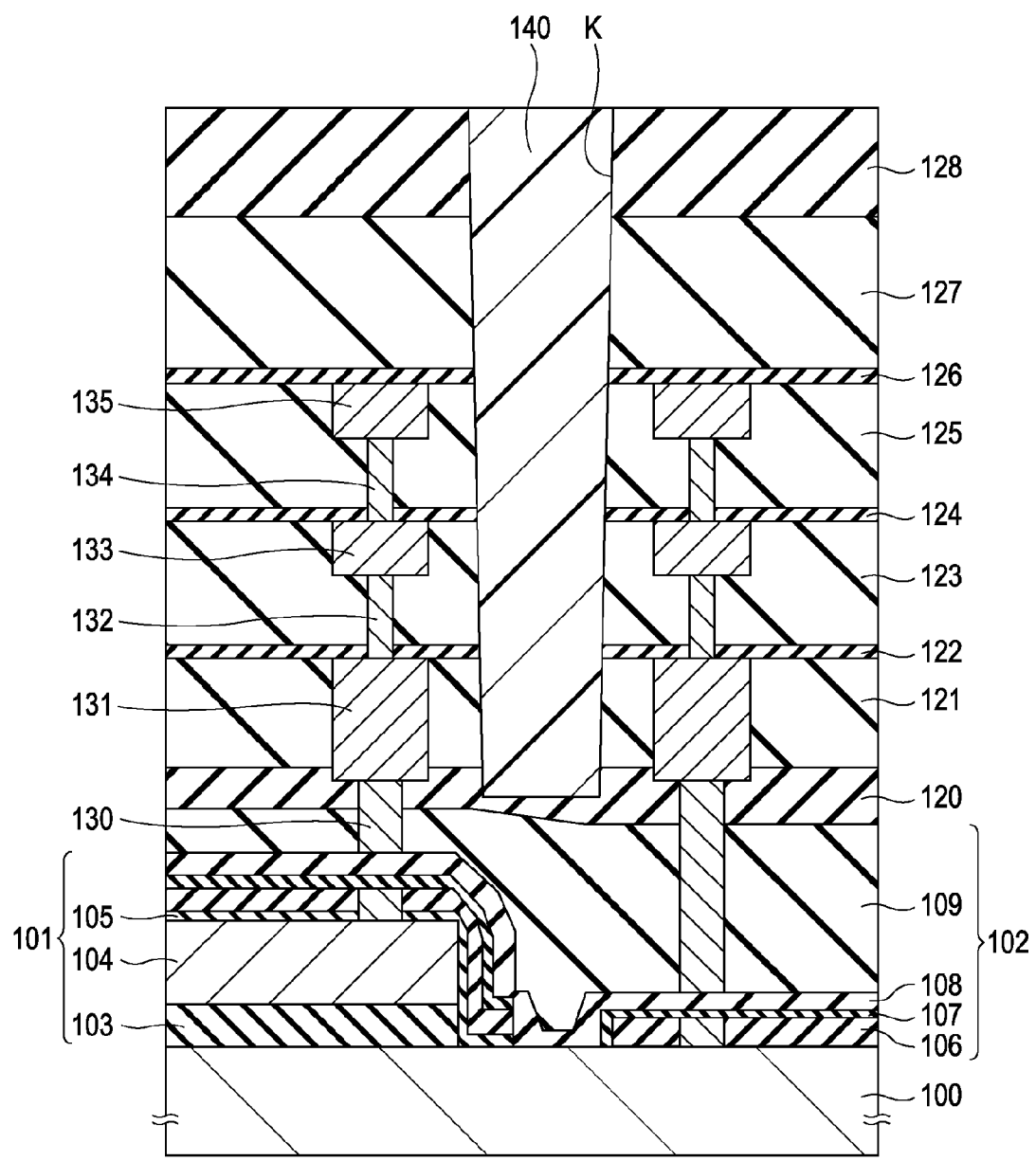
FIG. 15 is a sectional view showing a production process of a method for manufacturing the solid-state image pickup device according to the second embodiment of the present invention.

As shown in FIG. 15, the above-described resist film 150 is removed, and the inorganic substance having the heat resistance higher than that of the TiO-dispersion organic resin is filled in the concave portion K by, for example, a spin coating method at a film formation temperature of about 400° C., so as to form the core layer 140. Examples of inorganic substances to be filled in the concave portion K include oxides, e.g., silicon oxide. Subsequently, the inorganic substance deposited on the seventh insulating film 128 is polished by a chemical mechanical polishing (CMP) method or the like, so that planarization is performed.

Figure 16:
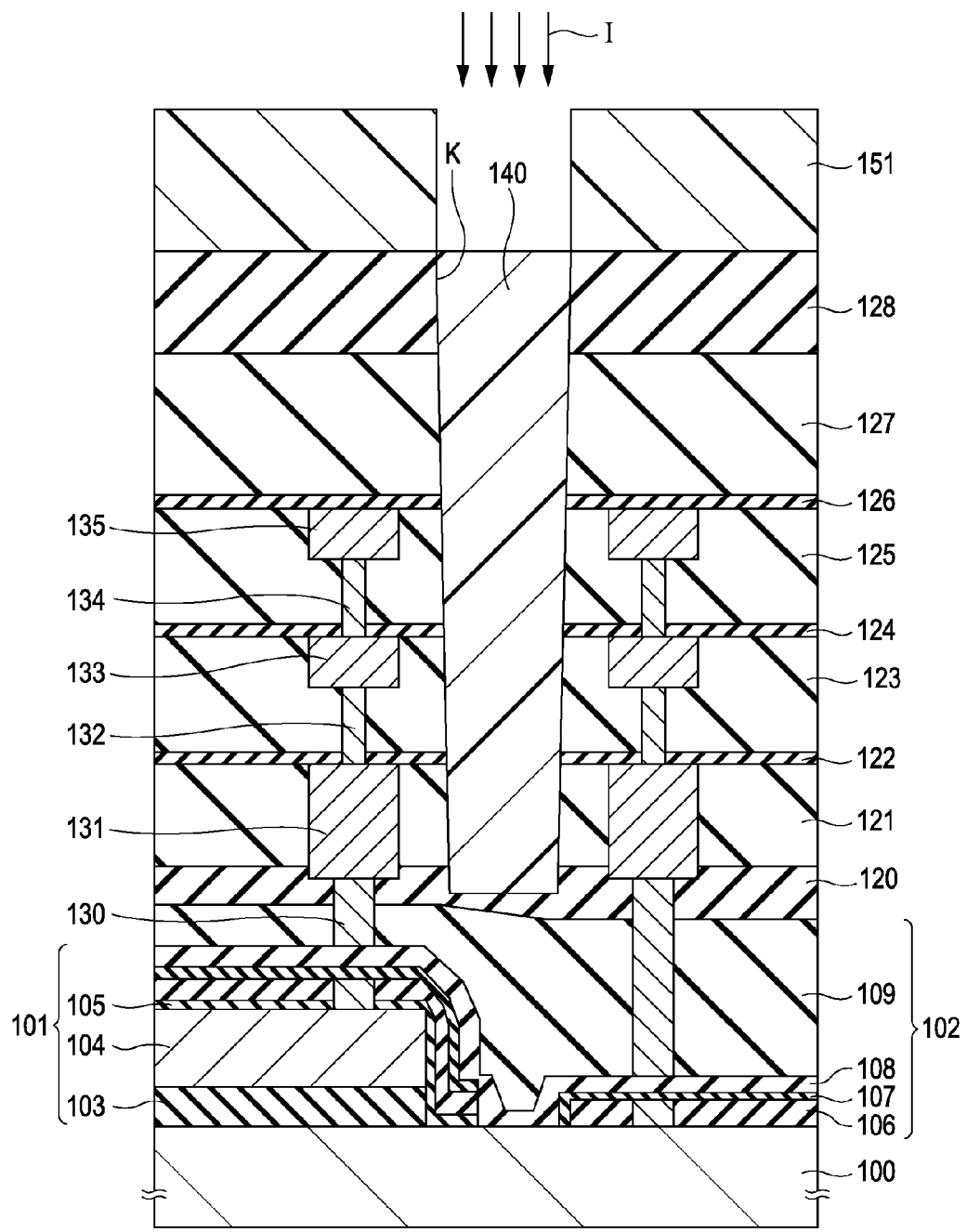
FIG. 16 is a sectional view showing a production process of a method for manufacturing the solid-state image pickup device according to the second embodiment of the present invention.

As shown in FIG. 16, for example, a resist film 151 with a pattern for opening the concave portion K is patterned by a photolithography step in such a way that merely the concave portion K is exposed. The metal oxide is ion-implanted by using the resist film 151 as a mask and, thereby, the metal oxide is contained in merely the inorganic substance filled in the concave portion K.

The planarizing resin layer 160 also functioning as, for example, an adhesive layer formed from an acrylic thermosetting resin or the like is formed as the layer on the above-described core layer 140. For example, the color filter 161 is formed as the layer thereon, so that the solid-state image pickup device having the configuration as shown in FIG. 12 is produced.

Furthermore, the microlens 162 is formed as the layer thereon.

Although not shown in the drawing, a plurality of light-receiving portions 101 are disposed in a matrix on the semiconductor substrate 100, and the color (one of three primary colors) of the color filter 161 corresponds to the color of the corresponding light-receiving portion 101.

Third Embodiment

Figure 17:
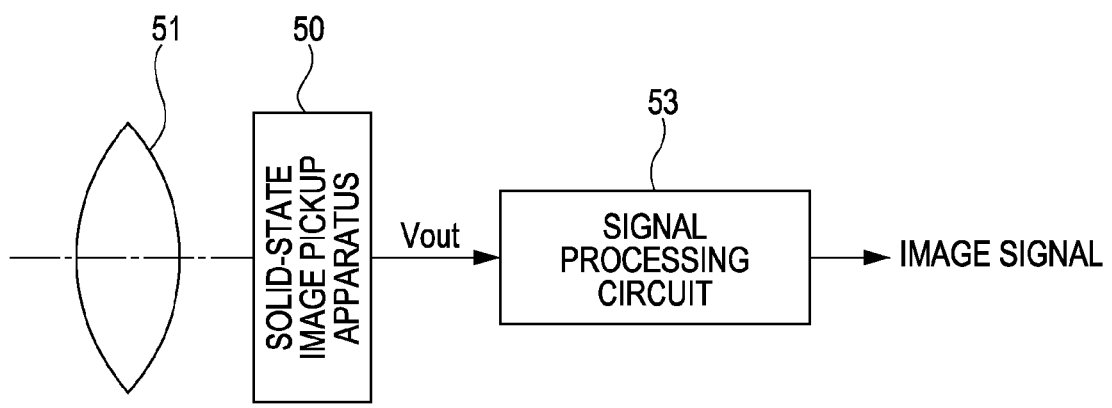
FIG. 17 is a schematic configuration diagram of a camera according to a third embodiment of the present invention.

FIG. 17 is a schematic configuration diagram of a camera according to the present embodiment.

A solid-state image pickup device 50 having a plurality of pixels integrated, an optical system 51, and a signal processing circuit 53 are included.

In the present embodiment, the above-described solid-state image pickup device 50 is set by incorporating the solid-state image pickup device according to any one of the above-described first to third embodiments.

The optical system 51 forms an image on the basis of the light of image from the subject (incident light) on a image pickup surface of the solid-state image pickup device 50. Consequently, conversion to a signal charge is performed in accordance with the amount of the incident light in the photodiode constituting each pixel on the image pickup surface of the solid-state image pickup device 50, and the resulting signal charge is stored for a predetermined time.

The stored signal charge is passed through, for example, a CCD charge transfer line, and is taken out as an output signal Vout.

The signal processing circuit 53 subjects the output signal Vout of the solid-state image pickup device 50 to various types of signal processing and outputs as an image signal.

According to the above-described camera of the present embodiment, color shading characteristics and dispersion characteristics can be improved without causing reduction of condensation rate of the obliquely incident light and deterioration of sensitivity. Furthermore, a microlens can be formed by a simple method and process.

The present invention is not limited to the above-described explanation.

For example, according to the embodiments, the present invention can be applied to both the MOS sensor and the CCD element.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device having a plurality of pixels integrated on a light-receiving surface, said device comprising:
    photodiodes which are disposed in pixel regions serving as the light-receiving surface of a semiconductor substrate;
    one or more insulating films, wherein at least one of the one or more insulating films is disposed on the semiconductor substrate and covering the photodiodes;
    one or more diffusion-preventing films disposed on at least one of the one or more insulating films;
    concave portions disposed in portions of the one or more insulating films above the photodiodes, the concave portions having bottom surfaces that are defined by portions of a first diffusion-preventing film of the one or more diffusion-preventing films;
    a passivation film which covers inner walls of the concave portions and entire bottom surfaces of the concave portions such that the passivation film is in contact with the first diffusion-preventing film at the bottom surfaces of the concave portions;
    wiring layers embedded in the one or more insulating films, wherein the wiring layers are disposed in the one or more insulating films in such a way as to form a mesh structure surrounding the concave portions, wherein the wiring layers and the insulating films are vertically alternatively laminated, wherein at least two of the wiring layers are embedded in an insulating film disposed directly below the first diffusion-preventing film and above the at least one of the one or more insulating films disposed on the semiconductor substrate, wherein at least two of the wiring layers are perpendicular to the at least two of the wiring layers embedded in the insulating film disposed directly below the first diffusion-preventing film and wherein at least a portion of the at least two of the wiring layers embedded in the insulating film disposed directly below the first diffusion-preventing film overlap at least one of the photodiodes; and
    a core layer filling the concave portions.

2. The solid-state image pickup device according to claim 1, wherein said passivation film extends towards a horizontal portion over an isolation region.

3. The solid-state image pickup device according to claim 1, further comprising:
    pad electrodes disposed as layers on the one or more insulating films in pad electrode regions; and wherein the passivation film is disposed as a layer above the pad electrodes.

4. The solid-state image pickup device according to claim 1, wherein the core layer has a refractive index higher than the refractive index of silicon oxide; and wherein the passivation film has a refractive index higher than the refractive index of silicon oxide.

5. The solid-state image pickup device according to claim 1, wherein the passivation film comprises a silicon nitride film.

6. The solid-state image pickup device according to claim 1, wherein the core layer comprises a resin layer.

7. The solid-state image pickup device according to claim 6, wherein the core layer comprises a siloxane based region.

8. The solid-state image pickup device according to claim 1, wherein at least one of the one or more insulating films serves as a top edge part of the concave portion, the top edge part of the concave portion forming a tapered opening that is upwardly divergent, and wherein the thickness of the passivation film is greater along the upwardly divergent tapered opening of the edge part of the concave portion than at the bottom surface of the concave portion.

9. A method for manufacturing a solid-state image pickup device having a plurality of pixels integrated on a light-receiving surface, the method comprising the steps of:
    forming photodiodes in pixel regions serving as the light-receiving surface;
    forming one or more insulating films on a semiconductor substrate, wherein at least one of the one or more insulating films covers the photodiodes;
    forming one or more diffusion-preventing films on at least one of the one or more insulating films;
    forming concave portions in portions of the one or more insulating films above the photodiodes, the concave portions having bottom surfaces that are defined by portions of a first diffusion-preventing film of the one or more diffusion-preventing films;
    forming a passivation film, the passivation film covering inner walls of the concave portions and entire bottom surfaces of the concave portions such that the passivation film is in contact with the first diffusion-preventing film at the bottom surfaces of the concave portions
    forming wiring layers embedded in the one or more insulating films, wherein the wiring layers are disposed in the one or more insulating films in such a way as to form a mesh structure surrounding the concave portions, wherein the wiring layers and the insulating films are vertically alternatively laminated, wherein at least two of the wiring layers are embedded in an insulating film disposed directly below the first diffusion-preventing film and above the at least one of the one or more insulating films disposed on the semiconductor substrate, wherein at least two of the wiring layers are perpendicular to the at least two of the wiring layers embedded in the insulating film disposed directly below the first diffusion-preventing film and wherein at least a portion of the at least two of the wiring layers embedded in the insulating film disposed directly below the first diffusion-preventing film overlap at least one of the photodiodes; and
    forming a core layer over the passivation film, the core layer filling the concave portions.

10. The method for manufacturing a solid-state image pickup device according to claim 9, further comprising:
    forming pad electrodes as layers on the one or more insulating films in pad electrode regions; and forming the passivation film as a layer on the pad electrodes.

11. The method for manufacturing a solid-state image pickup device according to claim 9, wherein the core layer has a refractive index higher than the refractive index of silicon oxide.

12. The method for manufacturing a solid-state image pickup device according to claim 9, wherein the passivation film has a refractive index higher than the refractive index of silicon oxide; and the core layer has a refractive index higher than the refractive index of silicon oxide.

13. The method for manufacturing a solid-state image pickup device according to claim 9, wherein the passivation film comprises silicon nitride.

14. The method for manufacturing a solid-state image pickup device according to claim 9, wherein the core layer comprises a resin.

15. The method for manufacturing a solid-state image pickup device according to claim 9, wherein at least one of the one or more insulating films serves as a top edge part of the concave portion, the top edge part of the concave portion forming a tapered opening that is upwardly divergent, and wherein the thickness of the passivation film is formed such that the passivation film is greater along the upwardly divergent tapered opening of the edge part of the concave portion than at the bottom surface of the concave portion.

16. A camera comprising:
a solid-state image pickup device having a plurality of pixels integrated on a light receiving surface;
an optical system for leading incident light to an image pickup portion of the solid-state image pickup device; and
a signal processing circuit for processing output signals from the solid-state image pickup device, wherein the solid-state image pickup device includes:
photodiodes which are disposed in pixel regions serving as the light-receiving surface of a semiconductor substrate;
one or more insulating films, wherein at least one of the one or more insulating films is disposed on the semiconductor substrate while covering the photodiodes,
one or more diffusion-preventing films disposed on at least one of the one or more insulating films;
concave portions disposed in portions of the one or more insulating films above the photodiodes, the concave portions having bottom surfaces that are defined by lower portions of a first diffusion-preventing film of the one or more diffusion-preventing films, wherein at least one of the one or more insulating films serves as a top edge part of the concave portion, the top edge part of the concave portion forming a tapered opening that is upwardly divergent;
a passivation film which covers inner walls of the concave portions and entire bottom surfaces of the concave portions such that the passivation film is in contact with the first diffusion-preventing film at the bottom surfaces of the concave portions;
wiring layers embedded in the one or more insulating films, wherein the wiring layers are disposed in the one or more insulating films in such a way as to form a mesh structure surrounding the concave portions, wherein the wiring layers and the insulating films are vertically alternatively laminated, wherein at least two of the wiring layers are embedded in an insulating film located below the first diffusion-preventing film and above the at least one of the one or more insulating films disposed on the semiconductor substrate, wherein at least two of the wiring layers are perpendicular to the at least two of the wiring layers embedded in the insulating film disposed directly below the and wherein at least a portion of the at least two of the wiring layers embedded in the insulating film disposed directly below the first diffusion-preventing film overlap at least one of the photodiodes; and
a core layer that fills the concave portions.

17. The solid-state image pickup device according to claim 16, wherein said passivation film extends towards a horizontal portion over an isolation region.

18. The solid-state image pickup device according to claim 16, further comprising:
pad electrodes disposed as layers on the one or more insulating films in pad electrode regions; and wherein the passivation film is disposed as a layer above the pad electrodes.

19. The solid-state image pickup device according to claim 16, wherein the core layer has a refractive index higher than the refractive index of silicon oxide; and the passivation film has a refractive index higher than the refractive index of silicon oxide.

20. The solid-state image pickup device according to claim 16, wherein the thickness of the passivation film is greater along the upwardly divergent tapered opening of the edge part of the concave portion than at the bottom surface of the concave portion.

* * * * *